(12) United States Patent
Ahn et al.

(10) Patent No.: US 11,481,032 B2
(45) Date of Patent: Oct. 25, 2022

(54) DISPLAY DEVICE

(71) Applicant: Samsung Display Co. Ltd., Yongin-si (KR)

(72) Inventors: Yi Joon Ahn, Seoul (KR); Jung Hun Noh, Yongin-si (KR); Jae Woo Im, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 441 days.

(21) Appl. No.: 16/450,574

(22) Filed: Jun. 24, 2019

(65) Prior Publication Data

US 2020/0103973 A1 Apr. 2, 2020

(30) Foreign Application Priority Data

Oct. 2, 2018 (KR) .......................... 10-2018-0117548

(51) Int. Cl.
*G06F 3/01* (2006.01)
*H01L 41/09* (2006.01)
(Continued)

(52) U.S. Cl.
CPC ............ *G06F 3/016* (2013.01); *G06F 1/1658* (2013.01); *H01L 41/09* (2013.01); *H04R 1/24* (2013.01);
(Continued)

(58) Field of Classification Search
CPC ...... G06F 3/016; G06F 1/1626; G06F 1/1688; G06F 3/16; G06F 1/1658; H01L 41/09; H04R 1/24; H04R 3/12; H04R 9/063; H04R 17/00; H04R 17/005; H04R 2400/03; H04R 2430/03; H04R 2499/11; H04R 2499/15; H04M 1/0266; H04M 1/03; H04M 2250/22
See application file for complete search history.

(56) References Cited

U.S. PATENT DOCUMENTS 10,200,772 B2    2/2019   Ahn et al.
10,409,325 B2    9/2019   Choi et al.
(Continued)

FOREIGN PATENT DOCUMENTS

CN         103874974      6/2014
CN         105096778     11/2015
(Continued)

OTHER PUBLICATIONS

Chinese Office Action—Chinese Application No. 201910868329.2 dated Jul. 8, 2022.

*Primary Examiner* — Julie Anne Watko
(74) *Attorney, Agent, or Firm* — Cantor Colburn LLP

(57) ABSTRACT

Provided are a display device. The display device comprises a display panel displaying an image, a main circuit board disposed under the display panel, a first vibration element attached to a lower surface of the display panel and providing first vibration in accordance with a first vibration signal, a second vibration element disposed on the main circuit board and providing second vibration in accordance with a second vibration signal, and a first vibration driver circuit providing the first vibration signal to the first vibration element, wherein a phase of the second vibration signal is opposite to a phase of the first vibration signal.

9 Claims, 19 Drawing Sheets

(51) Int. Cl.
  *G06F 1/16* (2006.01)
  *H04R 17/00* (2006.01)
  *H04R 3/12* (2006.01)
  *H04R 1/24* (2006.01)
  *H04M 1/03* (2006.01)
  *G06F 3/16* (2006.01)
  *H04R 9/06* (2006.01)
  *H04M 1/02* (2006.01)

(52) U.S. Cl.
  CPC ............ *H04R 3/12* (2013.01); *G06F 1/1626* (2013.01); *G06F 1/1688* (2013.01); *G06F 3/16* (2013.01); *H04M 1/0266* (2013.01); *H04M 1/03* (2013.01); *H04M 2250/22* (2013.01); *H04R 9/063* (2013.01); *H04R 17/00* (2013.01); *H04R 17/005* (2013.01); *H04R 2400/03* (2013.01); *H04R 2430/03* (2013.01); *H04R 2499/11* (2013.01); *H04R 2499/15* (2013.01)

(56) References Cited

U.S. PATENT DOCUMENTS

| | | | |
|---|---|---|---|
| 11,310,576 | B2 | 4/2022 | Ahn et al. |
| 11,317,180 | B2 | 4/2022 | Zu et al. |
| 2002/0149561 | A1* | 10/2002 | Fukumoto .......... G01C 21/3664 345/156 |
| 2013/0332892 | A1* | 12/2013 | Matsuki .................. G06F 3/016 715/863 |
| 2017/0280216 | A1 | 9/2017 | Lee et al. |

FOREIGN PATENT DOCUMENTS

| | | | |
|---|---|---|---|
| CN | 107295446 | | 10/2017 |
| CN | 108495244 | | 9/2018 |
| EP | 3264167 | | 1/2018 |
| JP | 5630119 | B2 * | 10/2014 |
| KR | 1020110073843 | | 6/2011 |
| KR | 101534428 | | 7/2015 |
| KR | 1020150096430 | | 8/2015 |
| KR | 101684141 | | 12/2016 |
| KR | 1020190041563 | | 4/2017 |
| KR | 101773011 | | 8/2017 |
| KR | 1020190070749 | A * | 6/2019 |
| WO | WO-2013057894 | A1 * | 4/2013 ............. G06F 3/016 |

* cited by examiner

DISPLAY DEVICE

This application claims priority to Korean Patent Application No. 10-2018-0117548, filed on Oct. 2, 2018, and all the benefits accruing therefrom under 35 U.S.C. 119, the content of which in its entirety is herein incorporated by reference.

BACKGROUND

1. Field

The disclosure relates to a display device, and more particularly to an organic light emitting display device including a vibration element.

2. Description of the Related Art

A display device for displaying an image has been widely used for various electronic appliances for providing an image to a user, such as smart phones, tablet personal computers ("PC"s), digital cameras, notebook computers, navigators, and televisions. The display device typically includes a display panel for displaying an image and a sound generator for providing a sound.

The sound generator may include a vibration element for outputting a sound. The vibration element is an element that converts electrical energy into mechanical vibration using an electromagnetic force generation principle. In such a vibration element, a piezo haptic actuator including a piezoelectric element may be used as a driving source. Further, in such a vibration element using a piezo haptic actuator including a piezoelectric element, an inverse piezoelectric effect principle of generating a displacement when applying a voltage to a piezoelectric element is used, and such a principle is a principle of generating a vibration force by moving a movable body by the generated displacement.

SUMMARY

According to an exemplary embodiment of the invention, a display device includes a display panel which displays an image, a lower frame disposed under the display panel, a first vibration element attached to a lower surface of the display panel, where the first vibration element generates a first vibration based on a first vibration signal, a second vibration element disposed under the lower frame, where the second vibration element generates a second vibration based on a second vibration signal, and a first vibration driver circuit which provides the first vibration signal to the first vibration element, where a phase of the second vibration signal is opposite to a phase of the first vibration signal.

According to another exemplary embodiment of the invention, a display device includes a display panel which displays an image, a lower frame disposed under the display panel, a first vibration element attached to a lower surface of the display panel, where the first vibration element generates a first vibration based with a first vibration signal, a second vibration element disposed under the lower frame, where the second vibration element generates a second vibration based on a second vibration signal, and a first vibration driver circuit which provides the first vibration signal to the first vibration element, where a phase of the second vibration signal is the same as a phase of the first vibration signal.

According to another exemplary embodiment of the invention, a display device includes a display panel which displays an image, a lower frame disposed under the display panel, a first vibration element attached to a lower surface of the display panel, wherein the first vibration element generates a first vibration based on a first vibration signal, a second vibration element which generates a second vibration based on a second vibration signal, and an integrated vibration driver circuit which provides the first vibration signal to the first vibration element and provides the second vibration signal to the second vibration element, where a phase of the second vibration signal is opposite to a phase of the first vibration signal.

Herein, embodiments of the invention are not restricted to the one set forth herein. The above and other features of the invention will become more apparent to one of ordinary skill in the art to which the invention pertains with reference to the detailed description below.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1A:
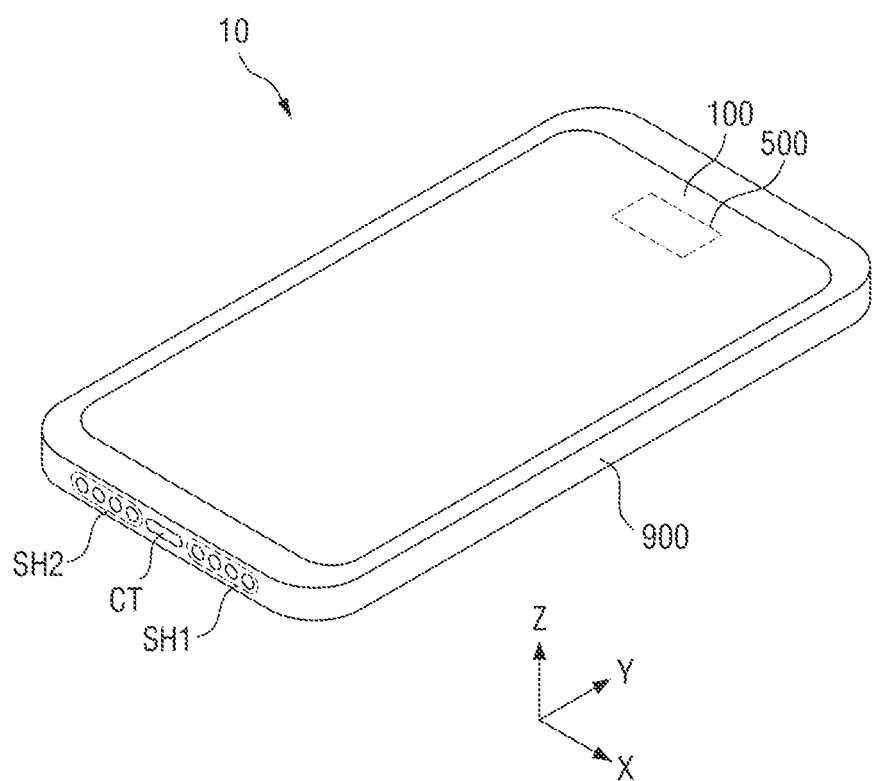
FIGS. 1A and 1B are perspective and exploded perspective views of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

The terminology used herein is for the purpose of describing particular embodiments only and is not intended to be limiting of the inventive concept. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, components may be exaggerated or reduced in size for convenience of explanation.

Throughout the specification, like reference numerals refer to like elements.

Hereinafter, embodiments of the invention will be described in detail with reference to the accompanying drawings.

Hereinafter, an embodiment of a display device will be described in detail with reference to FIGS. 1A to 8.

Figure 1B:
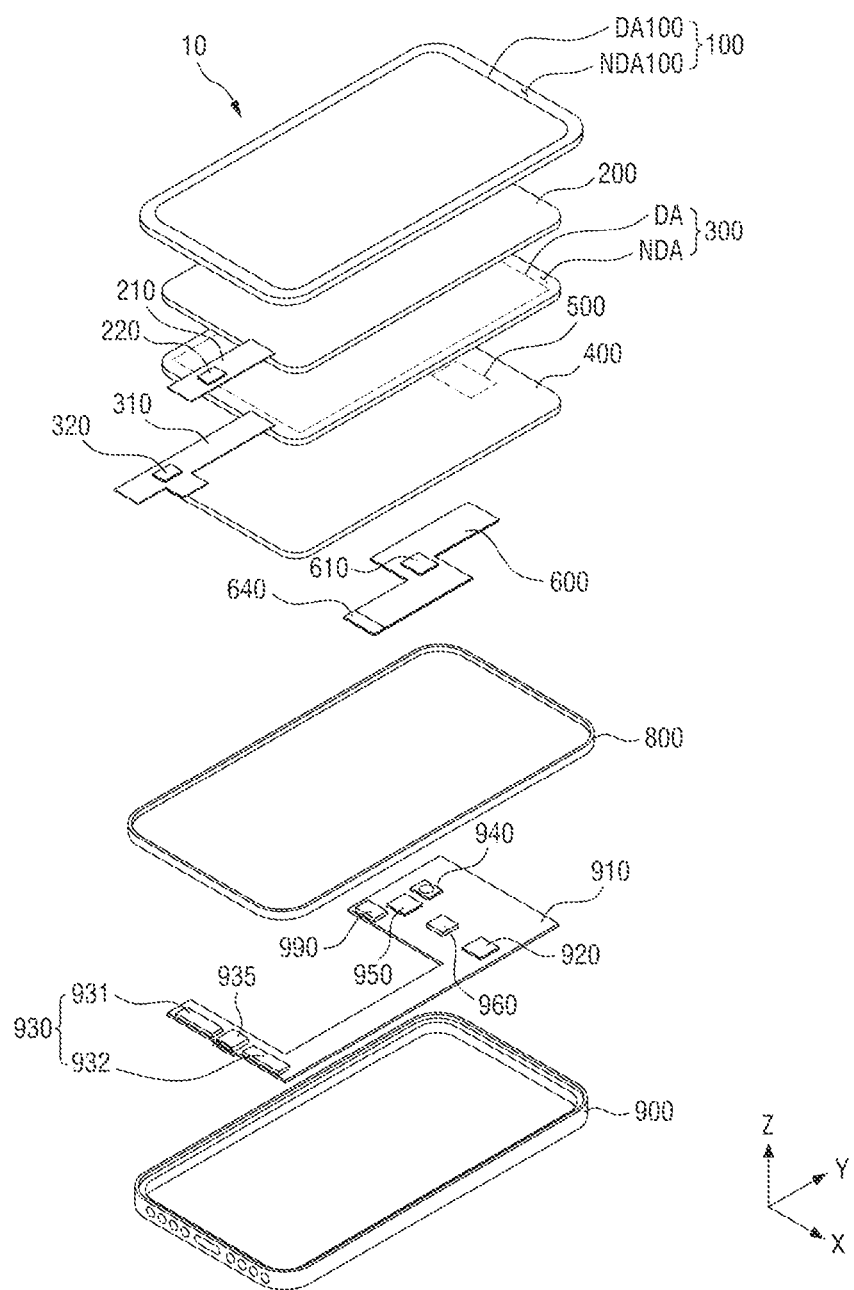
Figure 2:
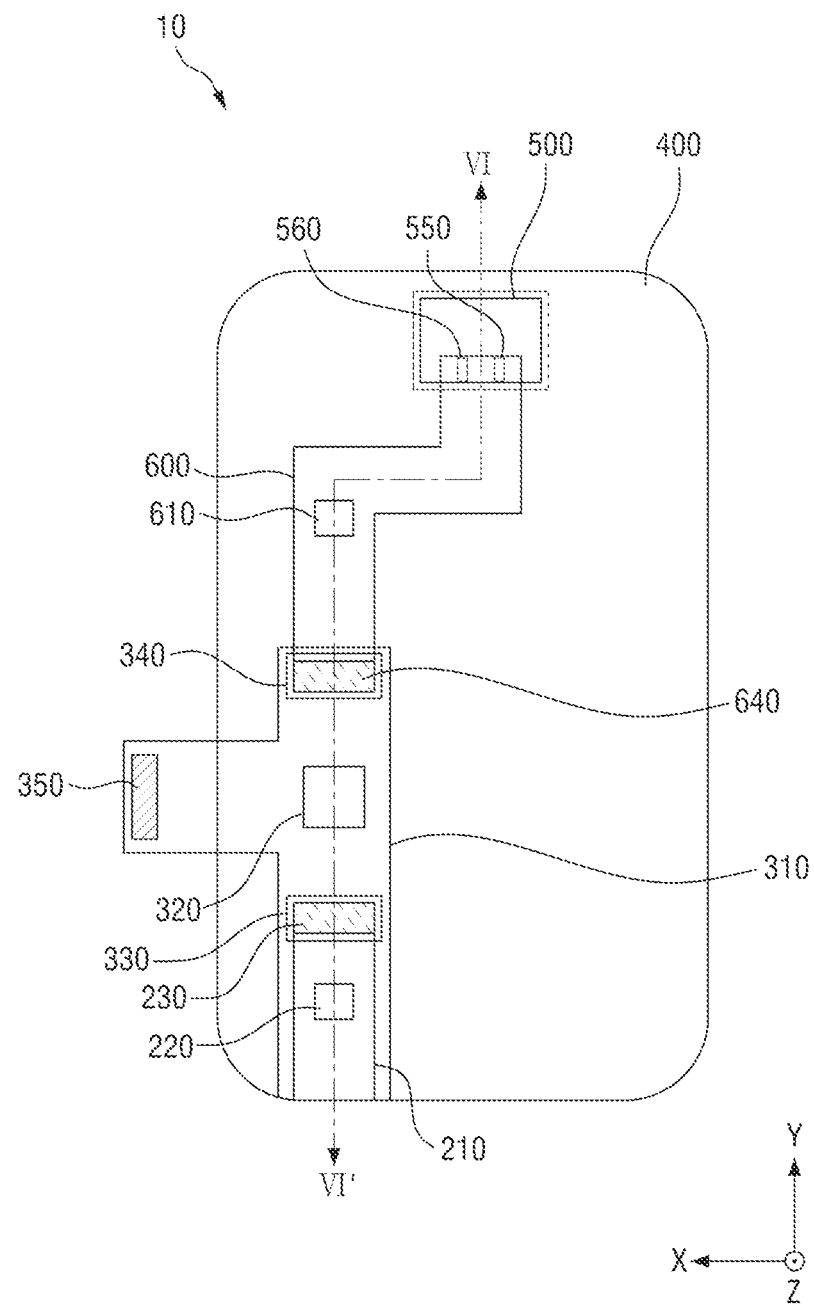
FIG. 2 is a rear view illustrating a panel lower member, a first vibration element, a vibration circuit board, a panel circuit board, and a touch circuit board in the display device of FIG. 1B.
Figure 3:
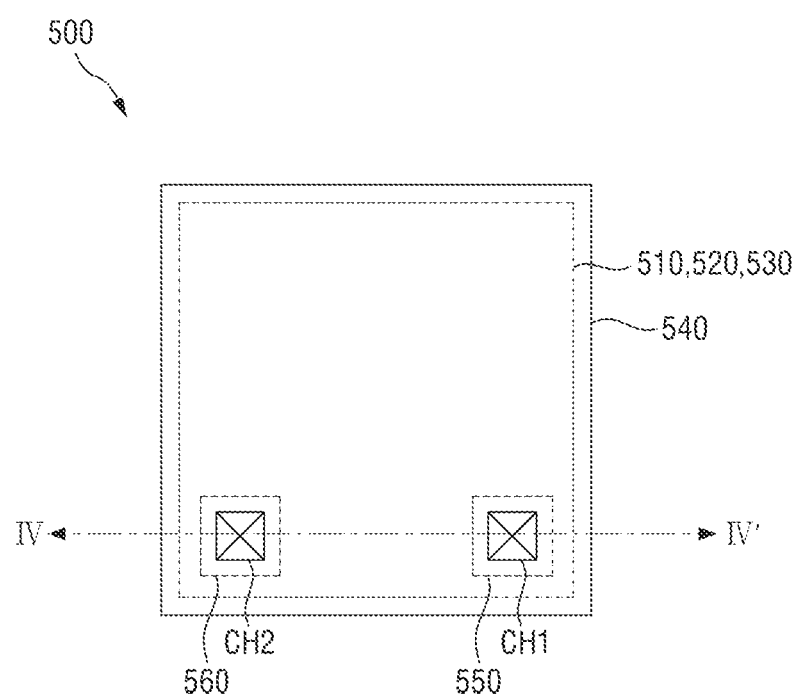
FIG. 3 is a plan view illustrating a first vibration element.
Figure 4:
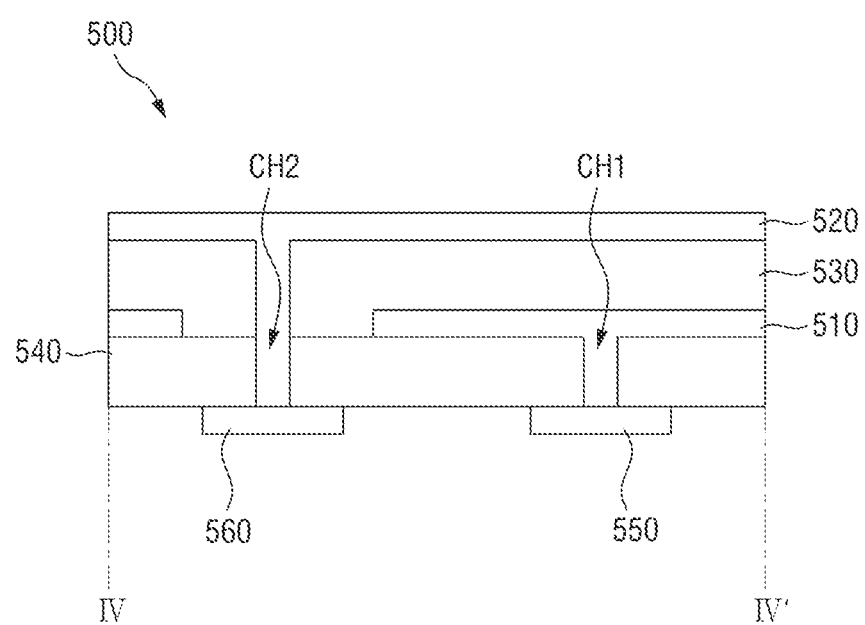
FIG. 4 is a cross-sectional view taken along line IV-IV' of FIG. 3.
Figure 5:
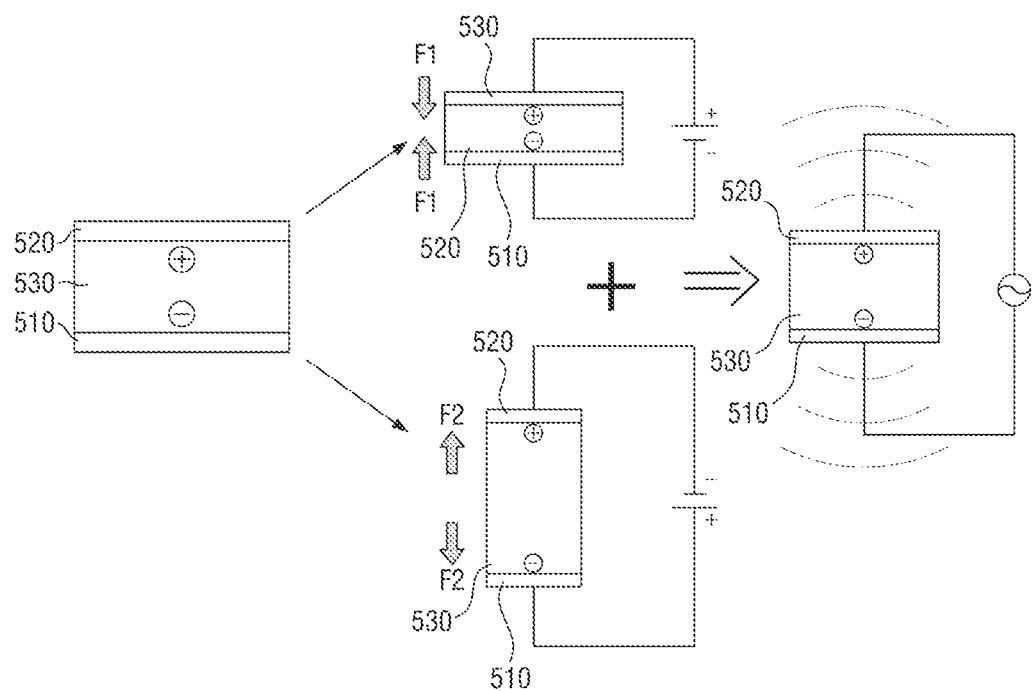
FIG. 5 is a conceptual view for explaining the operation characteristics of a first vibration element according to an embodiment.
Figure 6:
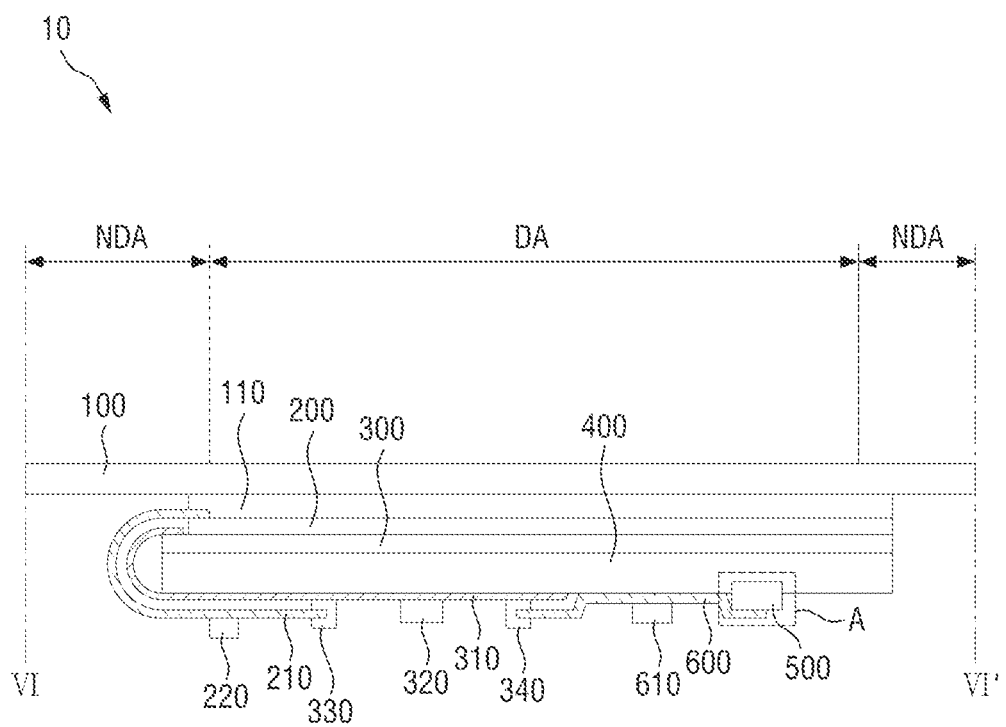
FIG. 6 is a cross-sectional view taken along line VI-VI' of FIG. 2.
Figure 7:
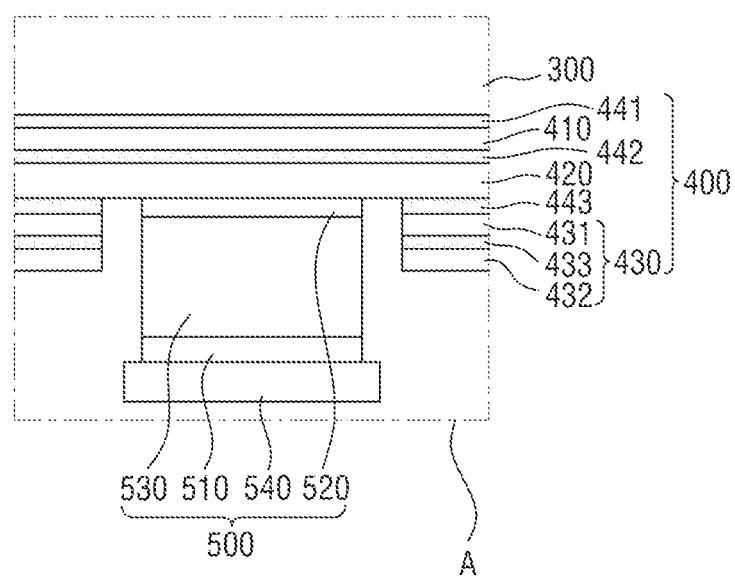
FIG. 7 is an enlarged cross-sectional view of the area A of FIG. 6.

FIGS. 1A and 1B are perspective and exploded perspective views of a display device according to an embodiment. FIG. 2 is a rear view illustrating a panel lower member, a first vibration element, a vibration circuit board, a panel circuit board, and a touch circuit board in the display device of FIG. 1B. FIG. 3 is a plan view illustrating a first vibration element. FIG. 4 is a cross-sectional view taken along line IV-IV' of FIG. 3. FIG. 5 is a conceptual view for explaining the operation characteristics of a first vibration element according to an embodiment. FIG. 6 is a cross-sectional view taken along line VI-VI' of FIG. 2. FIG. 7 is an enlarged cross-sectional view of the area A of FIG. 6.

Referring to FIGS. 1A and 1B, in an embodiment, a display device may be a portable terminal. The portable terminal may include a smart phone, a tablet personal computer ("PC"), a personal digital assistant ("PDA"), a portable multimedia player ("PMP"), a game machine, and a wrist watch-type electronic appliance. However, the display device according to an embodiment is not limited to the portable terminal, and may be used for not only large electronic appliances such as televisions and outside billboards but also middle and small electronic appliances such as monitors, notebook computers, automobile navigators, and cameras.

Referring to FIGS. 1A and 1B, an embodiment of a display device 10 includes a cover window 100, a touch sensing unit 200, a touch circuit board 210, a display panel 300, a display circuit board 310, a panel lower member 400, a first vibration element 500, a vibration circuit board 600, a lower frame 800, a main circuit board 910, and a lower cover 900.

Herein, the "on", "over", "top", "upper side", or "upper surface" refers to a direction in which the cover window 100 is disposed with respect to the display panel 300 or a thickness direction of the display panel 300, that is, a Z-axis direction, and the "beneath", "under", "bottom", "lower side", or "lower surface" refers to a direction in which the panel lower member 400 is disposed, that is, a direction opposite to the Z-axis direction, with respect to the display panel 300.

The display device 10 may have a rectangular shape in a plan view. In one exemplary embodiment, for example, as shown in FIG. 1A, the display device 10 may have a rectangular planar shape having short sides in the first direction (X-axis direction) and long sides in the second direction (Y-axis direction). The edge where the short side in the first direction (X-axis direction) meets the long side in the second direction (Y-axis direction) may have a round shape of a predetermined curvature or have a right angle shape. The planar shape of the display device 10 is not limited to a rectangular shape, and may be formed in another polygonal shape, circular shape, or elliptical shape.

The cover window 100 may be disposed on the display panel 300 to cover the upper surface of the display panel 300. Thus, the cover window 100 may function to protect the upper surface of the display panel 300. The cover window 100 may be attached to the touch sensing unit 200 through an adhesive member 110 as shown in FIG. 6. The adhesive member 110 may be an optically clear adhesive ("OCA") film or an optically clear resin ("OCR") film.

The cover window 100 may include a light transmitting area DA100 corresponding to a display area DA of the display panel 300 and a light blocking area NDA100 corresponding to a non-display area NDA of the display panel 300. In an embodiment, the light blocking area NDA100 may be opaque. Alternatively, the light blocking area NDA100 may be a decorative layer having a pattern that can be seen to a user when an image is not displayed. In one exemplary embodiment, for example, a company logo such as "SAMSUNG" or various characters may be patterned on the light blocking area NDA100.

The cover window 100 may include or be made of glass, sapphire, and/or plastic. The cover window 100 may be rigid or flexible.

The touch sensing unit 200 may be disposed between the cover window 100 and the display panel 300. The touch sensing unit 200 is a unit for sensing a touch position of a touch by a user. The touch sensing unit 200 may be implemented as a capacitive type such as a self-capacitance type or a mutual capacitance type, and may be implemented as an optical type, an infrared type, or an ultrasonic type.

The touch sensing unit 200 may be in a shape of a panel or a film, or may be formed integrally with the display panel 300. In one exemplary embodiment, for example, where the touch sensing unit 200 is formed in a shape of a film, the touch sensing unit 200 may be formed integrally with a barrier film 306 (shown in FIG. 8) for encapsulating the display panel 300.

In an embodiment, the touch sensing unit 200 may include a pressure sensor capable of sensing a user's pressure. Alternatively, the touch sensing unit 200 may be provided with a separate pressure sensing unit including a pressure sensor capable of sensing a user's pressure.

The touch circuit board 210 may be attached to one side of the touch sensing unit 200. In an embodiment, the touch circuit board 210 may be attached onto pads provided on one side of the touch sensing unit 200 using an anisotropic conductive film. In such an embodiment, the touch circuit board 210 may be provided with a touch connection portion 230, and the touch connection portion 230 may be connected to a first connector 330 of the display circuit board 310 as shown in FIG. 2. The touch circuit board 210 may be a flexible printed circuit board or in a chip-on-film type form.

The touch driving circuit 220 may apply touch driving signals to the touch sensing unit 200, sense sensing signals from the touch sensing unit 200, and analyze the sensing signals to calculate a touch position of the touch by the user.

The touch driving circuit 220 may include or be formed of an integrated circuit and may be disposed, e.g., mounted, on the touch circuit board 210.

The display panel 300 may include a display area DA and a non-display area NDA. The display area DA is an area where an image is displayed, and the non-display area NDA is an area where an image is not displayed. The non-display area NDA may be a peripheral area of the display area DA. In an embodiment, the non-display area NDA may be disposed to surround the display area DA as shown in FIGS. 1A and 1B, but the invention is not limited thereto. In an alternative embodiment, the display area DA may be disposed to overlap the light transmitting area DA100 of the cover window 100, and the non-display area DNA may be disposed to overlap the light blocking area NDA100.

The display panel 300 may be a light emitting display panel including a light emitting element. Examples of the display panel 300 may include an organic light emitting display panel using an organic light emitting diode, an ultra-small light emitting diode display panel using a micro light emitting diode, or a quantum dot light emitting diode display panel using a quantum dot light emitting diode. Hereinafter, embodiments where the display panel 300 is an organic light emitting display panel will be described for convenience of description, and will be described later in detail with reference to FIG. 8.

A polarizing film may be attached to the upper surface of the display panel 300 to prevent the deterioration of visibility due to external light reflection.

The display circuit board 310 may be attached to one side of the display panel 300. In an embodiment, the display circuit board 310 may be mounted on the pads provided on one side of the display panel 300 using an anisotropic conductive film.

The touch circuit board 210 and the display circuit board 310 may be bent downward from the display panel 300 or to be disposed on a lower surface of the display panel 300 as shown in FIG. 6. In such an embodiment, the vibration circuit board 600 is disposed beneath the panel lower member 400, such that the vibration circuit board 600 is not bent. The display circuit board 310 may be connected to the touch connection portion 230 of the touch circuit board 210 through the first connector 330. The display circuit board 310 may be connected to the vibration connection portion 640 of the vibration circuit board 600 through the second connector 340. The display circuit board 310 may be connected to the main circuit board 910 through the third connector 350. In an embodiment, as shown in FIG. 2, the display circuit board 310 includes the first to third connectors 330, 340 and 350, but the invention is not limited thereto. In one alternative exemplary embodiment, for example, the display circuit board 310 may include pads corresponding to the first and second connectors 330 and 340 instead of the first and second connectors 330 and 340. In such an embodiment, the display circuit board 310 may be connected to the touch circuit board 210 and the vibration circuit board 600 using anisotropic conductive films.

The display driving circuit 320 outputs signals and voltages for driving the display panel 300 through the display circuit board 310. The display driving circuit 320 may be formed as an integrated circuit and mounted on the display circuit board 310, but the invention is not limited thereto. In one exemplary embodiment, for example, the display driving circuit 320 may be attached to one side of the display panel 300.

The panel lower member 400 may be disposed on the lower surface of the display panel 300. The panel lower member 400 may include at least one of a heat radiation layer for efficiently discharging heat of the display panel 300, an electromagnetic wave blocking layer for blocking electromagnetic waves, a light blocking layer for blocking incident light from the outside, a light absorbing layer for absorbing incident light from the outside, and a buffer layer for absorbing an impact from the outside.

In an embodiment, as shown in FIG. 7, the panel lower member 400 may include a light absorbing member 410, a buffer member 420, a heat radiation member 430, and first to third adhesive layers 441, 442, and 443.

The light absorbing member 410 may be disposed under the display panel 300. The light absorbing member 410 may block a transmission of light to prevent components disposed thereunder, e.g., a first vibration element 500, from being visually recognized through the display panel 300. The light absorbing member 410 may include a light absorbing material such as black pigment or dye.

The buffer member 420 may be disposed under the light absorbing member 410. The buffer member 420 absorbs an external impact to prevent the display panel 300 from being damaged. The buffer member 420 may have a single layer structure or a multilayer structure including a plurality of layers. In one exemplary embodiment, for example, the buffer member 420 may include or be made of a polymer resin such as polyurethane, polycarbonate, polypropylene, or polyethylene, or may be made of an elastic material such as a rubber, a urethane-based material, or a sponge formed by foam-molding an acrylate-based material. The buffer member 420 may be a cushion layer.

The heat radiation member 430 may be disposed under the buffer member 420. The heat radiation member 430 may include one or more heat radiation layer. In one exemplary embodiment, for example, as shown in FIG. 7, the heat radiation member 430 may include a first heat radiation layer 431 including graphite or carbon nanotubes, a second heat radiation layer 432 including a metal thin film such as copper, nickel, ferrite or silver, capable of blocking electromagnetic waves and having high thermal conductivity, and a fourth adhesive layer 433 for attaching the first heat radiation layer 431 to the second radiation layer 432.

The first adhesive layer 441 attaches the light absorbing member 410 to the lower surface of the display panel 300. The second adhesive layer 442 attaches the buffer member 420 to the lower surface of the light absorbing member 410. The third adhesive layer 443 attaches the heat radiation member 430 to the lower surface of the buffer member 420. Each of the first to third adhesive layers 441, 442, and 443 may include at least one polymer material selected from a silicon-based polymer, a urethane-based polymer, a silicon-urethane polymer having a silicon-urethane hybrid structure, an acrylate-based polymer, an isocyanate-based polymer, polyvinyl alcohol-based polymer, a vinyl-based polymer, a latex-based polymer, a polyester, and an aqueous polyester.

The first vibration element 500 may be disposed on the lower surface of the panel lower member 400. If the first vibration element 500 is disposed on the heat radiation member 430 of the panel lower member 400, the first heat radiation layer 431 or second heat radiation layer 432 of the heat radiation member 430 may be broken by the vibration of the first vibration element 500. Therefore, in an embodiment, a portion of the heat radiation member 430 may be removed from an area where the first vibration element 500 is disposed, and the first vibration element 500 may be disposed on the buffer member 420. In such an embodiment, the an opening is defined through the heat radiation member 430 to expose a portion of the buffer member 420, and the first vibration element 500 may be disposed on an exposed portion of the buffer member 420 to be spaced apart from the head radiation member 430.

The first vibration element 500 may output first vibration by generating vibration in response to a first vibration signal. The first vibration element 500 may output a first sound by vibrating the display panel 300 through the first vibration. In an embodiment, the first vibration element 500 may be vibrated by a vibration layer 530 that is deformed in response to the first vibration signal. Alternatively, the first vibration element 500 may be vibrated by an electromagnetic force generated by flowing a current corresponding to the first vibration signal to a coil surrounding a magnet. Hereinafter, for convenience of description, embodiments where the first vibration element 500 generates a sound by vibrating the vibration layer 530 will be described in detail.

In such an embodiment, as shown in FIGS. 3 and 4, the first vibration element 500 may include a first electrode 510, a second electrode 520, a vibration layer 530, a substrate 540, a first pad 550, and a second pad 560.

The first electrode 510 may be disposed on a first surface of the substrate 540, the vibration layer 530 may be disposed on the first electrode 510, and the second electrode 520 may be disposed on the vibration layer 530.

Each of the first electrode 510 and the second electrode 520 may include or be made of a conductive material. In one exemplary embodiment, for example, the conductive material may be a transparent conductive material such as indium tin oxide ("ITO") or indium zinc oxide ("IZO"), an opaque metal material, a conductive polymer, or carbon nanotubes ("CNT").

The first electrode 510 may be connected to the first pad 550 through a first contact hole CH1 defined through the substrate 540. Thus, the first electrode 510 may receive a first driving voltage from a first vibration driver circuit 610 of the vibration circuit board 600 through the first pad 550.

The second electrode 520 may be connected to the second pad 560 through a second contact hole CH2 defined through the substrate 540. Thus, the second electrode 520 may receive a second driving voltage from a first vibration driver circuit 610 of the vibration circuit board 600 through the second pad 560.

The vibration layer 530 may be a piezo actuator that is deformed as shown in FIG. 5 depending on a difference between the voltage applied to the first electrode 510 and the voltage applied to the second electrode 520. In an embodiment, the vibration layer 530 may be at least one of a polyvinylidene fluoride ("PVDF") film, a piezoelectric body of piezoelectric zirconate titanate ("PZT"), and an electro-active polymer film.

In such an embodiment, the vibration layer 530 may be contracted by a first force F1 due to a difference between the voltage applied to the first electrode 510 and the voltage applied to the second electrode 520, and may be relaxed or expanded by a second force F2 due to the difference. In an embodiment, as shown in FIG. 5, when the vibration layer 530 adjacent to the first electrode 510 has properties of positive polarity and the vibration layer 530 adjacent to the second electrode 520 has properties of negative polarity, the vibration layer 530 may be contracted by the first force F1. In such an embodiment, when the vibration layer 530 adjacent to the first electrode 510 has properties of positive polarity and the vibration layer 530 adjacent to the second electrode 520 has properties of negative polarity, that is, when the first driving voltage having negative polarity is applied to the first electrode 510 and the second driving voltage having positive polarity is applied to the second electrode 520, the vibration layer 530 may be contracted by the second force F2. When the first driving voltage applied to the first electrode 510 and the second driving voltage applied to the second electrode 520 are alternately repeated in positive and negative polarities, the vibration layer 530 may repeat contraction and relaxation. Accordingly, the first vibration element 500 vibrates such that the display panel 300 vibrates up and down, thereby outputting a first sound.

In such an embodiment, where the first vibration element 500 vibrates the display panel 300 and outputs the first sound, the display panel 300 functions as a diaphragm. The greater the size of the diaphragm, the greater the intensity of sound pressure output from the diaphragm. Since the size of the diaphragm of a speaker device 930 applied to the display device 10 is smaller than the area of the display panel 300 which is a diaphragm of the first vibration element 500, when the display panel 300 is used as a diaphragm, the intensity of sound pressure of a sound may be greater than that of the speaker device 930.

When the display panel 300, as a diaphragm, outputs a sound, the intensity of sound pressure of the display panel 300 in the upward direction (Z-axis direction) may be the greatest. That is, the intensity of sound pressure in the lateral direction (X-axis direction, Y-axis direction) and downward direction (direction opposite to the Z-axis direction) of the display panel 300 may be less than the intensity of sound pressure in the upward direction. However, although sound output in the lateral direction and the downward direction is not the greatest, sound may be output by the first vibration of the first vibration element 500 even in the lateral direction and the downward direction.

The substrate 540 may include or be made of an insulating material, for example, a plastic. The first pad 550 and the second pad 560 may be connected with the vibration circuit board 600. The first pad 550 and the second pad 560 may include or be made of a conductive material.

The first vibration element 500 may be connected to the vibration circuit board 600. In an embodiment, the vibration circuit board 600 may be attached onto the first pad 550 and second pad 560 of the first vibration element 500 using an anisotropic conductive film. The vibration circuit board 600 may include a vibration connection portion 640 as shown in FIG. 2, and the vibration connection portion 640 may be connected to the second connector 340 of the display circuit board 310. The vibration circuit board 600 may be a flexible printed circuit board or in a chip-on-film type form.

The first vibration driver circuit 610 may include or be formed of an integrated circuit and mounted on the vibration circuit board 600. In an embodiment, the first vibration driver circuit 610 may generate a first vibration signal in response to first vibration data provided from a main processor 920 of the main circuit board 910. In such an embodiment, the first vibration data of the main processor 920 may be provided to the first vibration driver circuit 610 through the main circuit board 910, the display circuit board 310 and the vibration circuit board 600, and the first vibration signal generated from the first vibration driver circuit 610 may be transmitted to the first vibration element 500 through the vibration circuit board 600.

The first vibration driver circuit 610 may include a DSP ("DSP") for processing first vibration data as a digital signal, a digital-to-analog converter ("DAC") for converting the first vibration data as a digital signal, processed by the DSP, into a first vibration signal as an analog signal, and an amplifier for amplifying the first vibration signal, which is an analog signal converted by the DAC, and outputting the amplified first vibration signal.

In an embodiment of the display device 10 according to the invention, the first vibration element 500 is attached to the panel lower member 400 disposed under the display panel 300 and connected to the vibration circuit board 600 provided with the first vibration driver circuit 610, and the first vibration driver circuit 610 is connected to the display circuit board 310, thereby modulating the first vibration element 500 and the vibration circuit board 600 with the display panel 300 into one module.

The lower frame 800 may be disposed under the panel lower member 400 and the vibration circuit board 600. The lower frame 800 may be disposed to surround the cover window 100, the touch sensing unit 200, the display panel 300, the panel lower member 400, the first vibration element 500, the touch circuit board 210, the display circuit board 310, and the vibration circuit board 600. The lower frame 800 may include a synthetic resin, a metal, or a combination thereof.

In an embodiment of the display device 10, the side surface of the lower frame 800 may be exposed to the side surface of the display device 10. Alternatively, the lower frame 800 may be omitted, and only the lower cover 900 may be provided.

The main circuit board 910 may be disposed under the lower frame 800. The main circuit board 910 may be connected to the third connector 350 of the display circuit board 310 through a cable connected to the main connector 990. Thus, the main circuit board 910 may be electrically connected to the display circuit board 310, the touch circuit board 210 and the vibration circuit board 600. The main circuit board 910 may be a printed circuit board or a flexible printed circuit board.

As shown in FIG. 1B, the main circuit board 910 may include a main processor 920, a speaker device 930, a charging terminal 935, a camera 940, a second vibration element 950, and a second vibration driver circuit 960.

The main processor 920 may control the entire functions of the display device 10. In one exemplary embodiment, for example, the main processor 920 may output image data to the display driving circuit 320 of the display circuit board 310 such that the display panel 300 displays an image. In such an embodiment, the main processor 920 may output the first vibration data to the first vibration driver circuit 610 of the vibration circuit board 600 through the display circuit board 310 such that the first vibration element 500 outputs a sound. In such an embodiment, the main processor 920 may output a speaker device sound signal to the speaker device 930 such that the speaker device 930 outputs a sound.

The main processor 920 may be an application processor ("AP") including an integrated circuit.

The speaker device 930 may be a sound generator. In an embodiment, the speaker device 930 may include an amplifier and a sound output unit. In such an embodiment, the amplifier may amplify a speaker device sound signal (analog signal) and provide the amplified speaker device sound signal to the sound output unit, and the sound output unit may output a sound in response to the provided speaker device sound signal. Thus, the speaker device 930 may output a sound in response to the speaker device sound signal of the main processor 920.

The speaker device 930 may be disposed on one side of the main circuit board 910. In one exemplary embodiment, for example, as shown in FIGS. 1A and 1B, the speaker device 930 may be disposed at one side of the main circuit board 910 and provide a sound at one side of the display device 10 through speaker device holes SH1 and SH2 defined at one side of the lower cover 900. In an embodiment, the speaker device 930 may be disposed at another side of the main circuit board 910 and provide a sound at the another side of the display device 10 through speaker device holes defined at the another side of the lower cover 900. The one side and the another side of the display device 10 may be opposite to each other or face each other, but the invention is not limited thereto.

In an embodiment, as shown in FIGS. 1A and 1B, the speaker device 930 may include a first speaker 931 disposed at one side of the charging terminal 935 and a second speaker 932 disposed at an opposing side of the charging terminal 935, such that the charging terminal 935 is disposed between the first speaker 931 and the second speaker 932, but the invention is not limited thereto. In one alternative exemplary embodiment, for example, the speaker device 930 may be disposed at any one of both sides of the charging terminal 935. Alternatively, the charging terminal 935 may be disposed at any one of a position where the first speaker 931 is disposed and a position where the second speaker 932 is disposed, and the speaker device 930 may be disposed at a remaining position where the charging terminal 935 is not disposed.

The charging terminal 935 is a terminal to which power is supplied from the outside, and may be connected to a power supply unit of the main circuit board 910.

The camera device 940 processes an image frame such as a still image or a moving image obtained by an image sensor in a camera module and outputs the still image or the moving image to the main processor 920.

In an embodiment, the main circuit board 910 may further include a mobile communication module capable of transmitting and receiving a radio signal to/from at least one of a base station, an external terminal, and a server on a mobile communication network. The radio signal may include various types of data depending on a voice signal, a video call signal, or a text/multimedia message transmission/reception.

The second vibration element 950 may be disposed, e.g., mounted, on the main circuit board 910. The second vibration element 950 may be a vibration generator. In one exemplary embodiment, for example, the second vibration element 950 may be a linear resonance actuator ("LRA"). However, the invention is not limited thereto, and alternatively, the second vibration element 950 may be a vibration generator such as an eccentric rotating motor ("ERM") or a piezo actuator.

The second vibration element 950 may receive a second vibration signal from the second vibration driver circuit 960. The second vibration element 950 may vibrate in response to the second vibration signal to generate a second vibration. The second vibration element 950 may be disposed on the main circuit board 910 to vibrate the main circuit board 910, so that the lower frame 800 surrounding the main circuit board 910 and the lower cover 910 may also vibrate. In such an embodiment, the second vibration element 950 may case a vibration of the display device 10 as a whole. The second vibration element 950 may generate various vibrations such that a user using the display device 10 feels various tactile senses.

In an embodiment, the second vibration element 950 may generate a second sound by vibrating the display device 10. The second sound may be a medium/low frequency sound mainly including a frequency lower than that of the first sound. The second sound may be output evenly in all directions of the display device 10.

The second vibration driver circuit 960 may include or be formed of an integrated circuit and mounted on the main circuit board 910. The second vibration driver circuit 960 may generate a second vibration signal in response to second vibration data provided from the main processor 920 of the main circuit board 910. The second vibration driver circuit 960 may include an amplifier for amplifying the second vibration signal, which is an analog signal, and outputting the amplified second vibration signal. However, the invention is not limited thereto, and alternatively, the second vibration driver circuit 960 may receive the second vibration signal, which is an analog signal, from the main processor 920. Alternatively, the second vibration signal may be directly transmitted to the second vibration element 950 without passing through the second vibration driver circuit 960.

The lower cover 900 may disposed under the lower frame 800 and the main circuit board 910. The lower cover 900 may form a lower appearance or defined the lower most part of the display device 10. In such an embodiment, as shown in FIG. 1A, a charging terminal hole CT for exposing the charging terminal 935 and speaker holes SH1 and SH2 for outputting a sound from the speaker device 930 may be defined through one side surface of the lower cover 900. The lower cover 900 may include plastic and/or metal.

Figure 8:
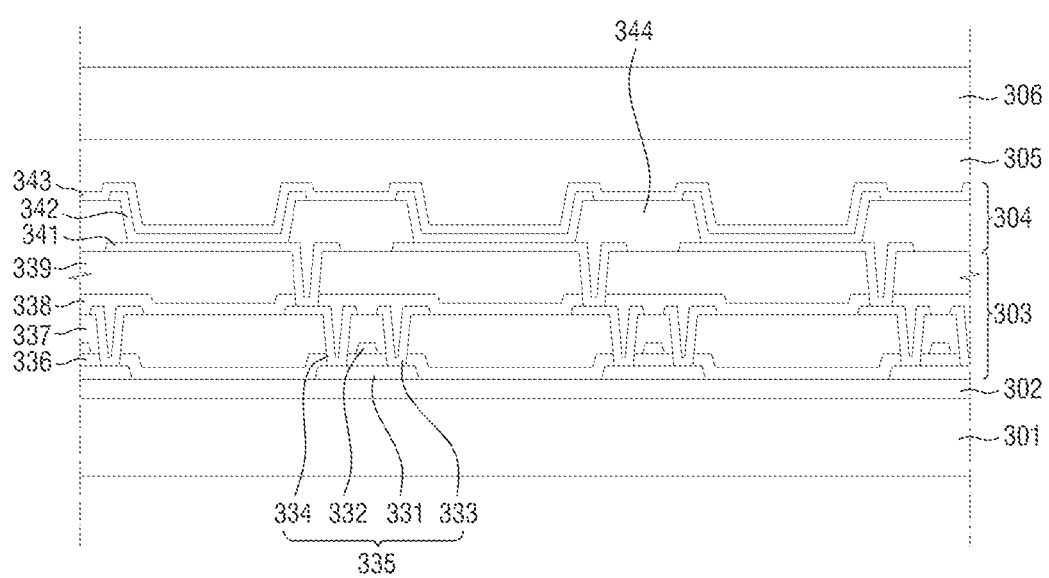
FIG. 8 is a cross-sectional view illustrating a display area of the display panel of FIG. 6.

FIG. 8 is a cross-sectional view illustrating a display area of the display panel of FIG. 6. FIG. 8 shows an embodiment where the display panel 300 is an organic light emitting display panel using an organic light emitting diode. The display area DA of the display panel 300 refers to an area where a light emitting element layer 304 is disposed to display an image, and the non-display area NDA thereof refers to an area around the display area DA.

Referring to FIG. 8, the display panel 300 may include a support substrate 301, a flexible substrate 302, a thin film transistor layer 303, a light emitting element layer 304, an encapsulation layer 305, and a barrier film 306.

The flexible substrate 302 is disposed on the support substrate 301. Each of the support substrate 301 and the flexible substrate 302 may include a polymer material having flexibility. In one exemplary embodiment, for example, each of the support substrate 301 and the flexible substrate 302 may include polyethersulphone ("PES"), polyacrylate ("PA"), polyarylate ("PAR"), polyetherimide ("PEI"), polyethylenenapthalate ("PEN"), polyethylene terepthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination thereof.

The thin film transistor layer 303 is disposed on the flexible substrate 302. The thin film transistor layer 303 includes a thin film transistor 335, a gate insulating film 336, an interlayer insulating film 337, a protective film 338, and a planarization film 339.

In an embodiment, a buffer film (not shown) may be disposed on the flexible substrate 302. The buffer film may be disposed on the flexible substrate 302 to protect thin film transistors 335 and light emitting elements from moisture penetrating through the support substrate 301 and the flexible substrate 302 which are vulnerable to moisture. The buffer film may include a plurality of inorganic films alternately laminated one on another. In one exemplary embodiment, for example, the buffer film may be a multi-layer film in which one or more inorganic layers including one or more of a silicon oxide (SiOx), a silicon nitride (SiNx), and SiON are alternately stacked. Alternatively, the buffer film may be omitted.

In such an embodiment, the thin film transistor 335 may be disposed on the buffer film. The thin film transistor 335 includes an active layer 331, a gate electrode 332, a source electrode 333, and a drain electrode 334. In an embodiment, as shown in FIG. 8, the thin film transistor 335 may have a top gate structure in which the gate electrode 332 is located on the active layer 331, but the invention is not limited thereto. Alternatively, the thin film transistor 335 may have a bottom gate structure in which the gate electrode 332 is located beneath the active layer 331, or may have a double gate structure in which the gate electrode 332 is located both on and beneath the active layer 331.

In such an embodiment, the active layer 331 may be disposed on the buffer film. The active layer 331 may include or be formed of a silicon-based semiconductor material or an oxide-based semiconductor material. A light blocking layer for blocking external light incident on the active layer 331 may be disposed between the buffer film and the active layer 331.

The gate insulating film 336 may be disposed on the active layer 331. The gate insulating film 336 may include or be formed of an inorganic film, for example, a silicon oxide (SiOx) film, a silicon nitride (SiNx) film, or a combination thereof.

The gate electrode 332 and a gate line may be disposed on the gate insulating film 336. The gate electrode 332 and the gate line may have a single layer structure or a multi-layer structure, each layer including at least one selected from molybdenum (Mo), aluminum (Al), chromium (Cr), gold (Au), titanium (Ti), nickel (Ni), neodymium (Nd) and copper (Cu) and an alloy thereof.

The interlayer insulating film 337 may be disposed on the gate electrode 332 and the gate line. The interlayer insulating film 337 may include or be formed of an inorganic film, for example, a silicon oxide (SiOx) film, a silicon nitride (SiNx) film, or a combination thereof.

The source electrode 333, the drain electrode 334 and a data line may be disposed on the interlayer insulating film 337. Each of the source electrode 333 and the drain electrode 334 may be connected to the active layer 331 through a contact hole defined the gate insulating film 336 and the interlayer insulating film 337. The source electrode 333, the drain electrode 334 and the data line may have a single layer structure or a multi-layer structure, each layer including at least one selected from molybdenum (Mo), aluminum (Al), chromium (Cr), gold (Au), titanium (Ti), nickel (Ni), neodymium (Nd) and copper (Cu), and an alloy thereof.

The protective film 338 for insulating the thin film transistor 335 may be disposed on the source electrode 333, the drain electrode 334 and the data line. The interlayer insulating film 337 may include or be formed of an inorganic film, for example, a silicon oxide (SiOx) film, a silicon nitride (SiNx) film, or a combination thereof.

The planarization film 339 for flattening a step due to the thin film transistor 335 may be disposed on the protective film 338. The planarization film 339 may include or be formed of an organic film including an acryl resin, an epoxy resin, a phenolic resin, a polyamide resin, or a PI resin.

The light emitting element layer 304 is disposed on the thin film transistor layer 303. The light emitting element layer 304 includes light emitting elements and a pixel defining film 344.

The light emitting elements and the pixel defining film 344 are disposed on the planarization film 339. In an embodiment, the light emitting element may be an organic light emitting element. In such an embodiment, the light emitting element may include an anode electrode 341, a light emitting layer 342, and a cathode electrode 343.

The anode electrode 341 may be disposed on the planarization film 339. The anode electrode 341 may be connected to the source electrode 333 of the thin film transistor 335 through a contact hole penetrating the protective film 338 and the planarization film 339.

The pixel defining film 344 may be disposed on the planarization film 339 to cover the edge of the anode electrode 341 to partition pixels. In an embodiment, the pixel defining film 344 serves to define pixels. Each of the pixels refers to an area where the anode electrode 341, the light emitting layer 342 and the cathode electrode 343 are sequentially laminated, and holes from the anode electrode 341 and electrons from the cathode electrode 343 are combined with each other in the light emitting layer 342 to emit light.

The light emitting layer 342 is disposed on the anode electrode 341 and the pixel defining film 344. The light emitting layer 342 may be an organic light emitting layer. The light emitting layer 342 may emit one of red light, green light, and blue light. The peak wavelength range of red light may be a range of about 620 nanometers (nm) to 750 nm, and the peak wavelength range of green light may be a range of about 495 nm to 570 nm. Further, the peak wavelength range of blue light may be a range of about 450 nm to 495 nm. In an embodiment, the light emitting layer 342 may be a white light emitting layer that emits white light. In such an embodiment, the light emitting layer 342 may have a laminate structure of a red light emitting layer, a green light emitting layer, and a blue light emitting layer, and may be a common layer formed commonly in the pixels. In such an embodiment, the display panel 300 may further include color filters for displaying red, green, and blue colors.

The light emitting layer 342 may include a hole transporting layer, a light emitting layer, and an electron transporting layer. In an embodiment, the light emitting layer 342 may have a tandem structure of two stacks or more, and in this case, a charge generating layer may be formed between the stacks.

The cathode electrode 343 is disposed on the light emitting layer 342. The cathode electrode 343 may be disposed to cover the light emitting layer 342. The cathode electrode 343 may be a common layer provided commonly in the pixels.

In an embodiment, where the light emitting element layer 304 has a top emission structure in which light is emitted upward, the anode electrode 341 may include or be formed of a high-reflectance metal material such as a laminate structure of aluminum and titanium (Ti/Al/Ti), a laminate structure of aluminum and ITO (ITO/Al/ITO), an APC alloy, or a laminate structure of an APC alloy and ITO (ITO/APC/ITO). The APC alloy may be an alloy of silver (Ag), palladium (Pd) and copper (Cu). The cathode electrode 343 may include or be formed of a transparent conductive material ("TCO") such as ITO or IZO, which is light-transmissive, or a semi-transmissive conductive material such as magnesium (Mg), silver (Ag), or an alloy of magnesium (Mg) and silver (Ag). In an embodiment, where the cathode electrode 343 is formed of a semi-transmissive conductive material, light emission efficiency may be increased by a microcavity.

In an alternative embodiment, where the light emitting element layer 304 has a bottom emission structure in which light is emitted downward, the anode electrode 341 may include or be formed of a TCO such as ITO or IZO, or a semi-transmissive conductive material such as magnesium (Mg), silver (Ag), or an alloy of magnesium (Mg) and silver (Ag). The second electrode 520 may include or be formed of a high-reflectance metal material such as a laminate structure of aluminum and titanium (Ti/Al/Ti), a laminate structure of aluminum and ITO (ITO/Al/ITO), an APC alloy, or a laminate structure of an APC alloy and ITO (ITO/APC/ITO). In an embodiment, where the anode electrode 341 is formed of a semi-transmissive conductive material, light emission efficiency may be increased by a microcavity.

The encapsulation layer 305 is disposed on the light emitting element layer 304. The encapsulation layer 305 serves to prevent oxygen or moisture from permeating the light emitting layer 342 and the cathode electrode 343. In such an embodiment, the encapsulation layer 305 may include an inorganic film to prevent oxygen or moisture from permeating the light emitting layer 342 and the cathode electrode 343. The inorganic film may include or be formed of silicon nitride, aluminum nitride, zirconium nitride, titanium nitride, hafnium nitride, tantalum nitride, silicon oxide, aluminum oxide, or titanium oxide. The encapsulation layer 305 may further include an organic film. The organic film may have a thickness great enough to prevent foreign matter (particles) from penetrating the encapsulation layer 305 and entering the light emitting layer 342 and the cathode electrode 343. The organic film may include at least one selected from epoxy, acrylate, and urethane acrylate.

The barrier film 306 is disposed on the encapsulation layer 305. The barrier film 306 covers the encapsulation layer 305 to protect the light emitting element layer 304 from oxygen or moisture. The barrier film 306 may be formed integrally with the touch sensing unit 200.

Figure 9:
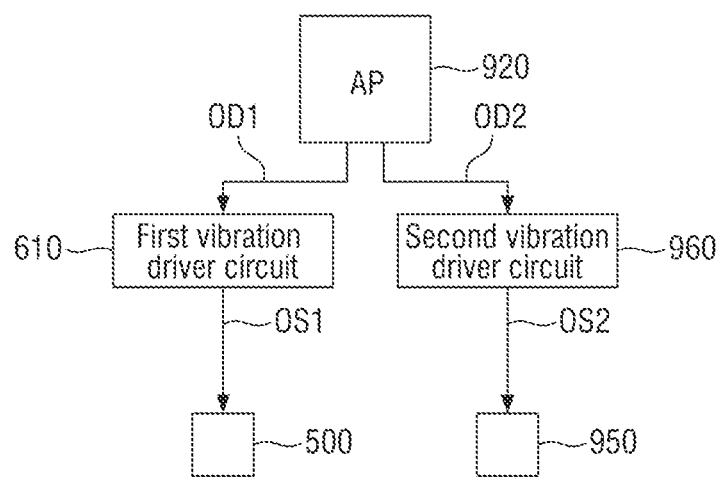
FIG. 9 is a block diagram illustrating a method of driving a first vibration element and a second vibration element according to an embodiment.

FIG. 9 is a block diagram illustrating a method of driving a first vibration element and a second vibration element according to an embodiment.

Referring to FIG. 9, the main processor 920 may generate a first vibration data OD1 to the first vibration driver circuit 610, and may provide second vibration data OD2 to the second vibration driver circuit 960. The first vibration data OD1 and the second vibration data OD2 may be digital data including information on the amplitude and frequency of a voltage for driving the first vibration element 500 and the second vibration element 950. However, the invention is not limited thereto. In an alternative embodiment, the first vibration data OD1 and/or the second vibration data OD2 may be an analog signal, not a digital signal.

The first vibration driver circuit 610 may receive the first vibration data OD1 to generate a first vibration signal OS1, and the second vibration driver circuit 960 may receive the second vibration data OD2 to generate a first vibration signal OS2. The first vibration signal OS1 and the second vibration signal OS2 may be analog signals. That is, the first vibration signal OS1 and the second vibration signal OS2 may be voltage signals for driving the first vibration element 500 and the second vibration element 950.

The first vibration element 500 and the second vibration element 950 may vibrate or control vibrations thereof according to the amplitude and frequency of the first vibration signal OS1 and the second vibration signal OS2 and may output vibrations of various patterns. The first vibration element 500 may output a first vibration, and the second vibration element 950 may output a second vibration.

The first vibration signal OS1 may be different from the second vibration signal OS2, and thus the first vibration of the first vibration element 500 may be different from the second vibration of the second vibration element 950. In an embodiment, the second vibration signal OS2 transmitted to the second vibration element 950 may be a reverse-phase signal inverted from the first vibration signal OS1. The second vibration element 950 may vibrate in opposition to the first vibration element 500, and vibrations in directions other than the upward direction of the display panel 300 among the vibrations generated by the first vibration element 500 may be offset and reduced. The second vibration, which is a reverse phase to the first vibration, will be described in detail with reference to FIG. 1B and FIGS. 10A to 10D.

FIGS. 10A to 10D are graphs illustrating first vibration of a first vibration element, second vibration of a second vibration element, vibration of a display panel, and vibration of a display device according to an embodiment. In FIGS. 10A to 10D, t-axis indicates time, and x-axis indicates a vertical displacement according to vibration.

Figure 10A:
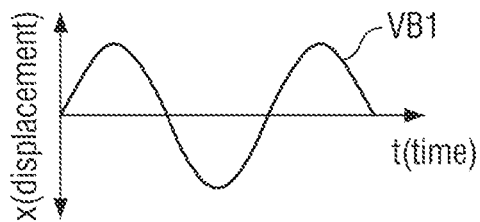
FIGS. 10A to 10D are graphs illustrating first vibration of a first vibration element, second vibration of a second vibration element, vibration of a display panel, and vibration of a display device according to an embodiment.

The curve VB1 in FIG. 10A indicates the vibration of the first vibration element 500 according to the first vibration signal OS1. As described with reference to FIG. 1B, the first vibration element 500 may be attached to the lower surface of the display panel 300 and vibrate the display panel 300 to output a sound. That is, the curve VB1 in FIG. 10A may be a display panel vibration curve when the first vibration element 500 receives the first vibration signal OS1 and vibrates.

The display panel 300 may vibrate due to the first vibration of the first vibration element 500. The sound generated by the vibration of the display panel 300 may be greatly output in the upward direction of the display panel 300, but may also be output in the lateral direction and the downward direction of the display panel 300. However, vibration other than vibration of the display panel 300 for outputting a sound may cause inconvenience to the user. Furthermore, the sound output in a direction other than the upward direction of the display panel 300 may lead to personal information leakage and privacy invasion. Accordingly, in an embodiment of the invention, the second vibration element 950 may vibrate in a direction opposite to the first vibration element 500 to offset vibrations other than vibration of the display panel 300 to remove the sound output in a direction other than the upward direction of the display panel 300.

Figure 10B:
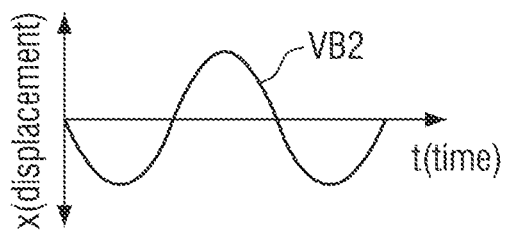

The curve VB2 in FIG. 10B indicates the vibration of the second vibration element 950 according to the second vibration signal OS2. As described above, the second vibration element 950 may vibrate in opposition to the first vibration element 500 to offset the first vibration generated by the first vibration element 500. As shown in FIGS. 10A and 10B, for example, the curve VB1 in FIG. 10A illustrates the first vibration element 500 that vibrates in order of top, bottom, and top according to time, and the curve VB2 in FIG. 10B illustrates the second vibration element 950 that vibrates in order of bottom, top, and bottom according to time.

Figure 10C:
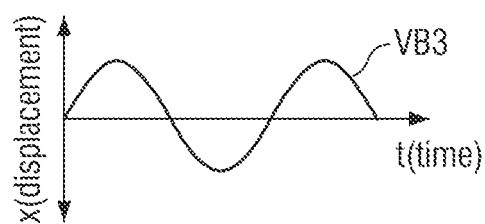
Figure 10D:
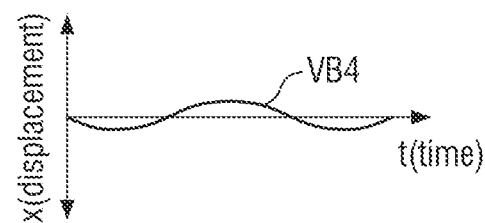

Referring to FIGS. 10C and 10D, the curve VB3 in FIG. 10C illustrates the vibration of the display panel 300 when the first vibration element 500 and the second vibration element 950 generate vibration. The curve VB4 in FIG. 10D illustrates the vibration of the display device 10 when the first vibration element 500 and the second vibration element 950 generate vibration.

As described above, the first vibration element 500 may be attached to the lower surface of the display panel 300 to vibrate the display panel 300. Thus, the display panel 300 may vibrate to provide a first sound to the user. The vibration generated by the first vibration element 500 may be transmitted to an upper position of (or a position above) the display panel 300 to the greatest extent. The second vibration element 950 may be disposed on the main circuit board 910 to vibrate the main circuit board 910. Thus, the lower frame 800 and the lower cover 900, each supporting the main circuit board 910, may vibrate. The vibration of the lower frame 800 and the lower cover 900 may cause the display device 10 to vibrate, so that vibration evenly occurs throughout the display device 10. That is, the vibration generated by the second vibration element 950 may be evenly transmitted to the upper, lower, and side portions of the display device 10. The second vibration generated by the second vibration element 950 may be opposite in phase to the first vibration generated by the first vibration element 500, such that the first vibration and the second vibration offset each other to disappear or the magnitude of the vibration may be reduced.

The vibration transmitted to the lower and the side portions of the display panel 300, in the first vibration generated by the first vibration element 500, may be offset by the second vibration generated by the second vibration element 950 and thus disappear. The vibration transmitted to the upper position of the display panel 300, in the first vibration, may be offset by the second vibration and thus disappear, but an offset effect may be insufficient because the magnitude of the second vibration transmitted to the upper position of the display panel 300 is less than the magnitude of the first vibration. As shown by the curve VB3 of FIG. 10C, the vibration curve of the display panel 300 after the first vibration is offset by the second vibration may not be greatly different from the curve VB1 of FIG. 10A. That is, the magnitude of the vibration or sound transmitted to a position above the display panel 300 may be greatly reduced without significantly decreasing the magnitude of the vibration or sound transmitted to the lower and side positions (or positions below and at a side) of the display panel 300. In such an embodiment, the magnitude of the overall vibration of the display device 10 after the offset caused by the second vibration may be greatly reduced as shown by the curve VB4 in FIG. 10D. When the magnitude of the second vibration is larger than the magnitude of the first vibration offset at the lower and side positions of the display panel 300, the vibration of the display device 10 after the offset may be similar to the second vibration, and when the magnitude of the second vibration is smaller than the magnitude of the first vibration, the vibration of the display device 10 after the offset may be similar to the first vibration. Further, when the magnitude of the second vibration is equal to the magnitude of the first vibration offset at the lower and side positions of the display panel 300, the vibration of the display device 10 may completely disappear.

In an embodiment, as described above, the first vibration transmitted to the lower and side positions of the display panel 300, in the first vibration generated by the first vibration element 500, is offset by the second vibration generated by the second vibration element 950 to decrease or disappear, and the magnitude of the first vibration transmitted to a position above the display panel 300 may not be greatly influenced by the first vibration element 500. Accordingly, in such an embodiment, any undesired effect by vibrations that occur throughout the display device 10 may be effectively prevented, and vibration or sound may be effectively prevented from leaking to the lower and side positions of the display panel 300.

In another embodiment, the second vibration element 950 may vibrate to provide haptic feedback to the user. In this case, the second vibration generated by the second vibration element 950 may be transmitted to the display panel 300, and unintended sound may be generated from the display panel 300. Similar to the above mentioned, the first vibration element 500 may vibrate to remove or reduce vibrations of the display panel 300 which generates the unintended sound. The unintended sound generated from the display panel 300 may be removed or reduced. Thus, while providing haptic feedback to the user, the unintended sound may be removed or reduced.

In an alternative embodiment, the first vibration signal and the second vibration signal may include the same phase as each other. The second vibration element 950 may output a sound mainly including a lower frequency than the first vibration element 500. Therefore, when the second vibration has the same phase as the first vibration, a more desirable sound may be provided to the user. Hereinafter, sound characteristics of the first vibration element 500 and the second vibration element 950 will be described in greater detail with reference to FIGS. 11A to 11C.

Figure 11A:
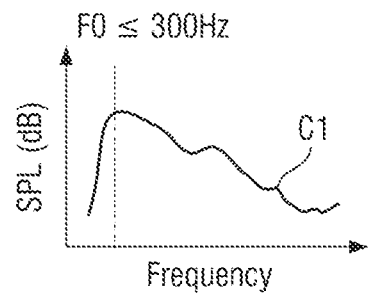
FIGS. 11A to 11C are graphs illustrating the sound pressure levels of sound of a first vibration element, sound of a second vibration element, and synthetic sound of the first vibration element and the second vibration element with respect to frequency.
Figure 11B:
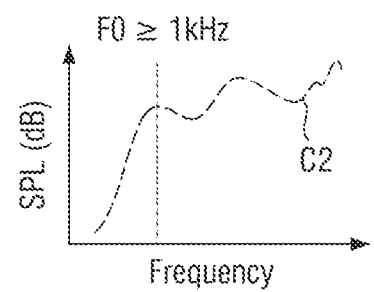
Figure 11C:
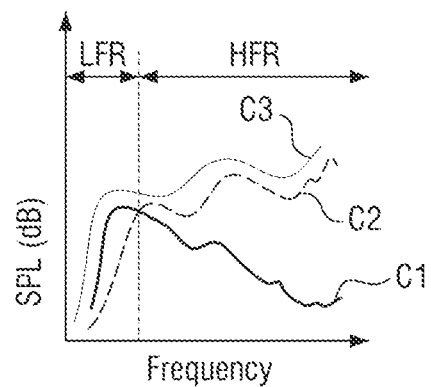

FIGS. 11A to 11C are graphs illustrating the sound pressure levels of sound of a first vibration element, sound of a second vibration element, and synthetic sound of the first vibration element and the second vibration element with respect to frequency.

As shown by the curve C1 in FIG. 11A and the curve C2 in FIG. 11B, when controlling fundamental zero (0) (hereinafter, will be referred to as "F0") of the first vibration element 500 to be different from F0 of the second vibration element 950, the frequency range of a sound provided to the user may extend as shown in the curve C3 in FIG. 11C, such that a more sufficient or desirable sound may be provided to the user. In FIG. 11A to 11C, the X-axis indicates a frequency, the Y-axis indicates a sound pressure level SPL, and F0 indicates the minimum frequency at which the diaphragm displacement of the vibration element becomes larger than the reference displacement.

Specifically, as shown in FIG. 11A, the second vibration element 950 may output a second sound having a F0 of 300 megahertz (MHz) or lower. In contrast, as shown in FIG. 11B, the first vibration element 500 may output a first sound having a F0 of 1 kilohertz (KHz) or higher. In this case, the second sound has a high sound pressure level SPL in a low frequency range LFR as compared with the first sound, whereas the first sound has a high sound pressure level in a high frequency range HFR as compared with the second sound. Therefore, when providing sounds to the user using the first vibration element 500 and the second vibration element 950, the sound pressure level may increase in both the low frequency range LFR and the high frequency range HFR as shown in FIG. 11C. In such an embodiment of the display device 10, the frequency range of a sound to be provided to the user may be effectively expanded, thereby providing a more sufficient sound.

Hereinafter, other alternative embodiments of the display device will be described. In the following embodiments, the same or like components as those of the embodiments described above will be labeled with the same reference numerals, any repetitive detailed description thereof will be omitted or simplified, and differences between the other components will be mainly described.

Figure 12:
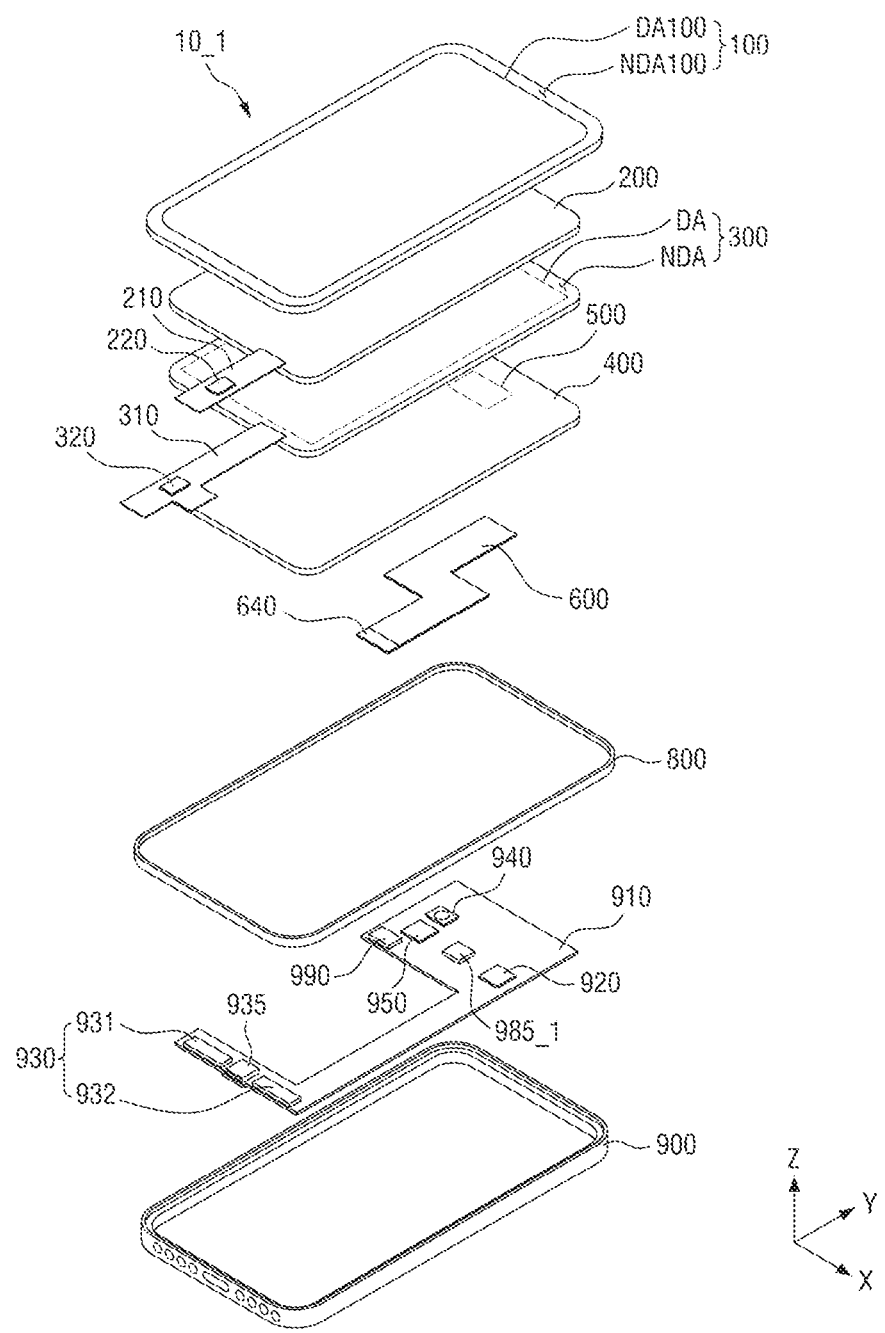
FIG. 12 is an exploded perspective view of a display device according to an alternative embodiment.
Figure 13:
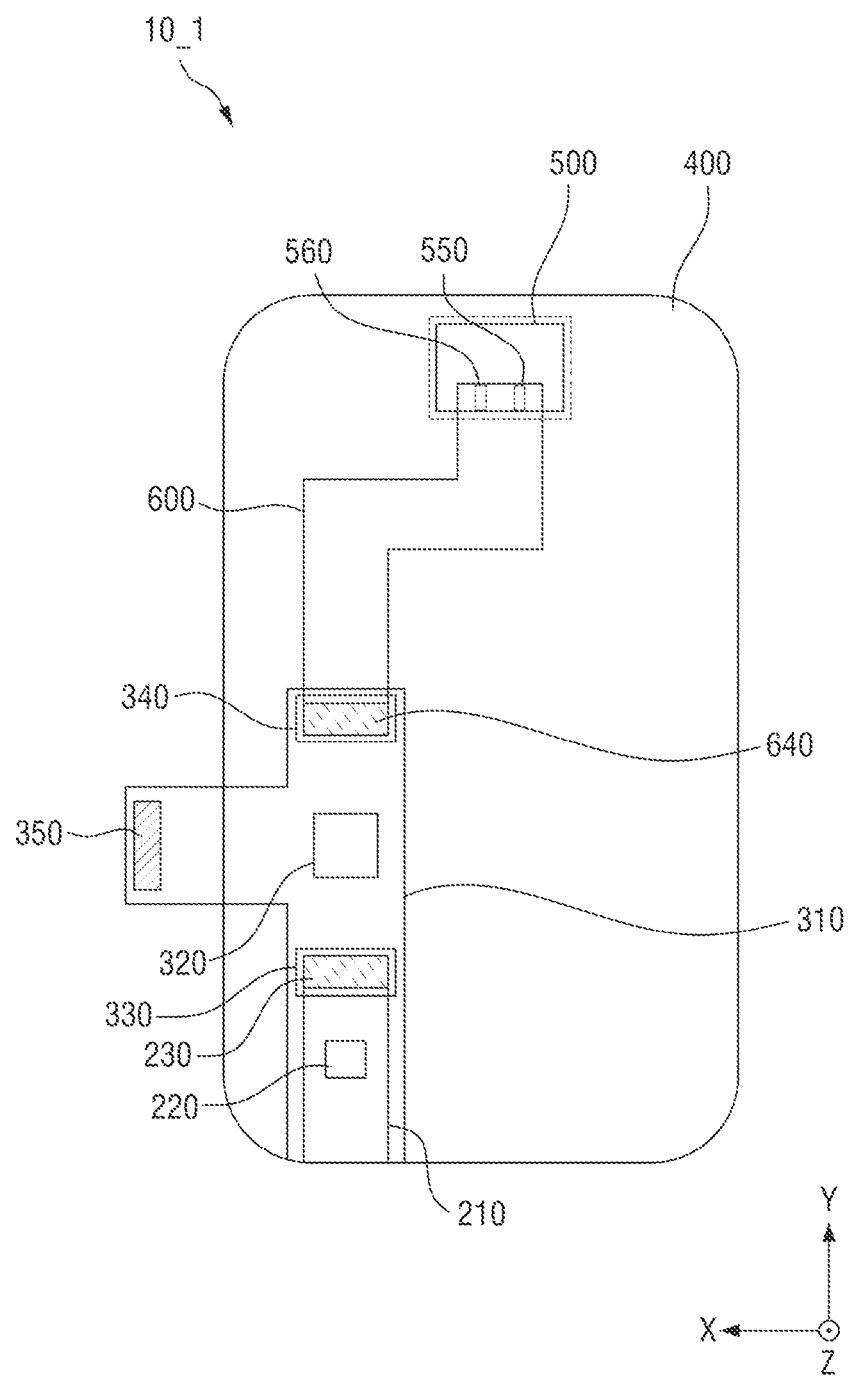
FIG. 13 is a rear view illustrating a panel lower member, a first vibration element, a vibration circuit board, a panel circuit board, and a touch circuit board in the display device of FIG. 12.

FIG. 12 is an exploded perspective view of a display device according to an alternative embodiment. FIG. 13 is a rear view illustrating a panel lower member, a first vibration element, a vibration circuit board, a panel circuit board, and a touch circuit board in the display device of FIG. 12.

An embodiment shown in FIGS. 12 and 13 is different from the embodiment of FIGS. 1B and 2 in that an integrated vibration driver circuit 985_1 is provided instead of the first vibration driver circuit (610 of FIG. 1B) to transmit vibration signals to a first vibration element 500 and a second vibration element 950. Any repetitive detailed description of the same or like elements as those in the embodiment shown in FIGS. 1B and 2 will be omitted.

Referring to FIGS. 12 and 13, an integrated vibration driver circuit 985_1 may be disposed on the main circuit board 910. The integrated vibration driver circuit 985_1 may generate a third vibration signal and a fourth vibration signal in response to the third vibration data and fourth vibration data provided from the main processor 920 of the main circuit board 910.

The third vibration signal of the integrated vibration driver circuit 985_1 may be provided to the first vibration element 500 through the main circuit board 910, the display circuit board 310, and the vibration circuit board 600, and the fourth vibration signal thereof may be provided to the second vibration element 950 through a circuit on the main circuit board 910.

In an embodiment, the integrated vibration driver circuit 985_1 may be disposed adjacent to the main processor 920 and the second vibration element 950. In such an embodiment, where the integrated vibration driver circuit 985_1 is disposed adjacent to the main processor 920 and the second vibration element 950, the main processor 920 may provide vibration data with less noise to the integrated vibration driver circuit 985_1, and the integrated vibration driver circuit 985_1 may provide a vibration signal with less noise to the second vibration element 950. However, the position of the integrated vibration driver circuit 985_1 is not limited thereto, and alternatively, the integrated vibration driver circuit 985_1 may be disposed on the vibration circuit board 600.

The integrated vibration driver circuit 985_1 may include a DSP for processing the third vibration data and fourth vibration data of the main processor 920, a DAC for converting digital data into the third vibration signal and the fourth vibration signal, which are analog data, and an amplifier for amplifying the third vibration signal and the fourth vibration signal and outputting such amplified signals.

The integrated vibration driver circuit 985_1 may receive the fourth vibration data from the main processor 920, generate the fourth vibration signal, and provide the generated fourth vibration signal to the second vibration element 950. However, in an alternative embodiment, the integrated vibration driver circuit 985_1 may receive the fourth vibration signal from the main processor 920. In such an embodiment, the integrated vibration driver circuit 985_1 may amplify the provided fourth vibration signal and provide the amplified fourth vibration signal to the second vibration element 950.

The first vibration element 500 may be attached to the lower surface of the display panel 300 and may receive the third vibration signal from the integrated vibration driver circuit 985_1. The first vibration element 500 outputs the third vibration in response to the third vibration signal, and thus may output a third sound. The magnitude of the vibration by the first vibration element 500 may be the greatest at a position above the display panel 300, and may be the least at the lower and side positions of the display panel 300. The second vibration element 950 may be disposed on the main circuit board 910 and may receive the fourth vibration signal from the integrated vibration driver circuit 985_1. The second vibration element 950 outputs the fourth vibration in response to the fourth vibration signal, thereby outputting the fourth sound. The fourth vibration by the second vibration element 950 may be generated throughout the display device 10_1. That is, the magnitudes of vibrations generated by the second vibration element 950 at the upper, lower, and side positions of the display device 10_1 may be similar to each other.

In an embodiment, as described above, the vibrations generated toward the lower and side positions of the display panel 300, among the vibrations generated by the third vibration, may be offset by the fourth vibration. In such an embodiment, the phase of the fourth vibration may be opposite to the phase of the third vibration. In such an embodiment, the phase of the fourth vibration signal provided to the second vibration element 950 may be opposite to the phase of the third vibration signal provided to the first vibration element 500.

Figure 14:
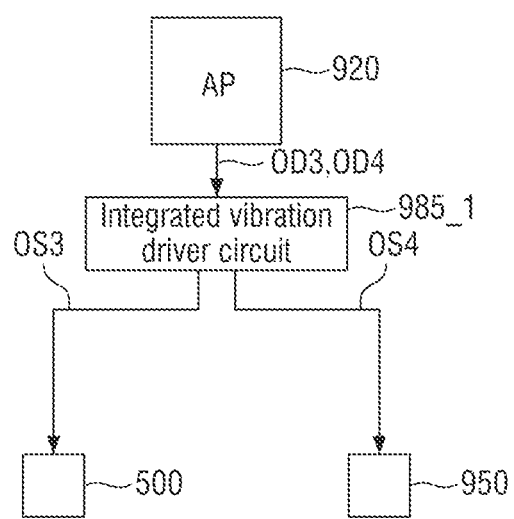
FIG. 14 is a block diagram illustrating a method of driving a first vibration element and a second vibration element according to an alternative embodiment.

FIG. 14 is a block diagram illustrating a method of driving a first vibration element and a second vibration element according to an alternative embodiment.

Referring to FIG. 14, the main processor 920 may provide third vibration data OD3 and forth vibration data OD4 to the integrated vibration driver circuit 985_1. The third vibration data OD3 and the fourth vibration data OD4 may be digital data including information on the amplitude and frequency of a voltage for driving the first vibration element 500 and the second vibration element 950. However, the invention is not limited thereto. In another alternative embodiment, the third vibration data OD3 and/or the fourth vibration data OD4 may be an analog signal, not a digital signal.

The integrated vibration driver circuit 985_1 may receive the third vibration data OD3 and the forth vibration data OD4 to generate a third vibration signal OS3 and a fourth vibration signal OS4. The third vibration signal OS3 and the fourth vibration signal OS4 may be analog signals. In such an embodiment, the third vibration signal OS3 and the fourth vibration signal OS4 may be voltage signals for driving the first vibration element 500 and the second vibration element 950.

The first vibration element 500 and the second vibration element 950 may control vibrations according to the amplitude and frequency of the third vibration signal OS3 and the fourth vibration signal OS4 and may output vibrations of various patterns. The first vibration element 500 may output a third vibration, and the second vibration element 950 may output a fourth vibration.

The third vibration signal OS3 may be different from the fourth vibration signal OS4, and thus the third vibration of the first vibration element 500 may be different from the fourth vibration of the second vibration element 950. In such an embodiment, as described above, the fourth vibration signal OS4 transmitted to the second vibration element 950 may be a reverse-phase signal inverted from the third vibration signal OS3, or may be a signal the same as the third vibration signal OS3.

Figure 15A:
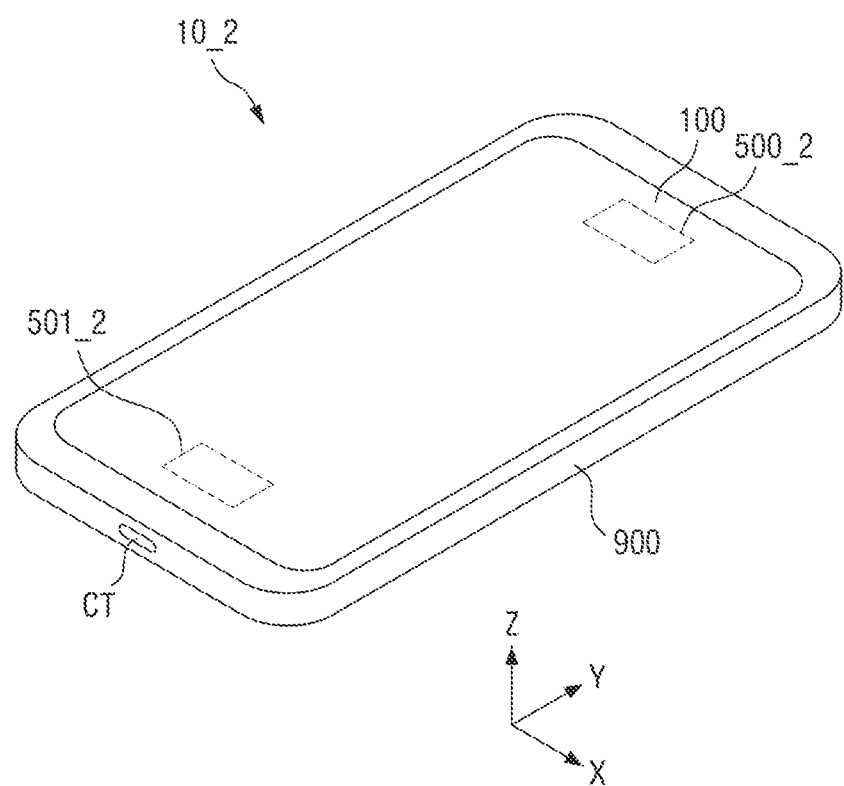
FIGS. 15A and 15B are perspective and exploded perspective views of a display device according to another alternative embodiment.
Figure 15B:
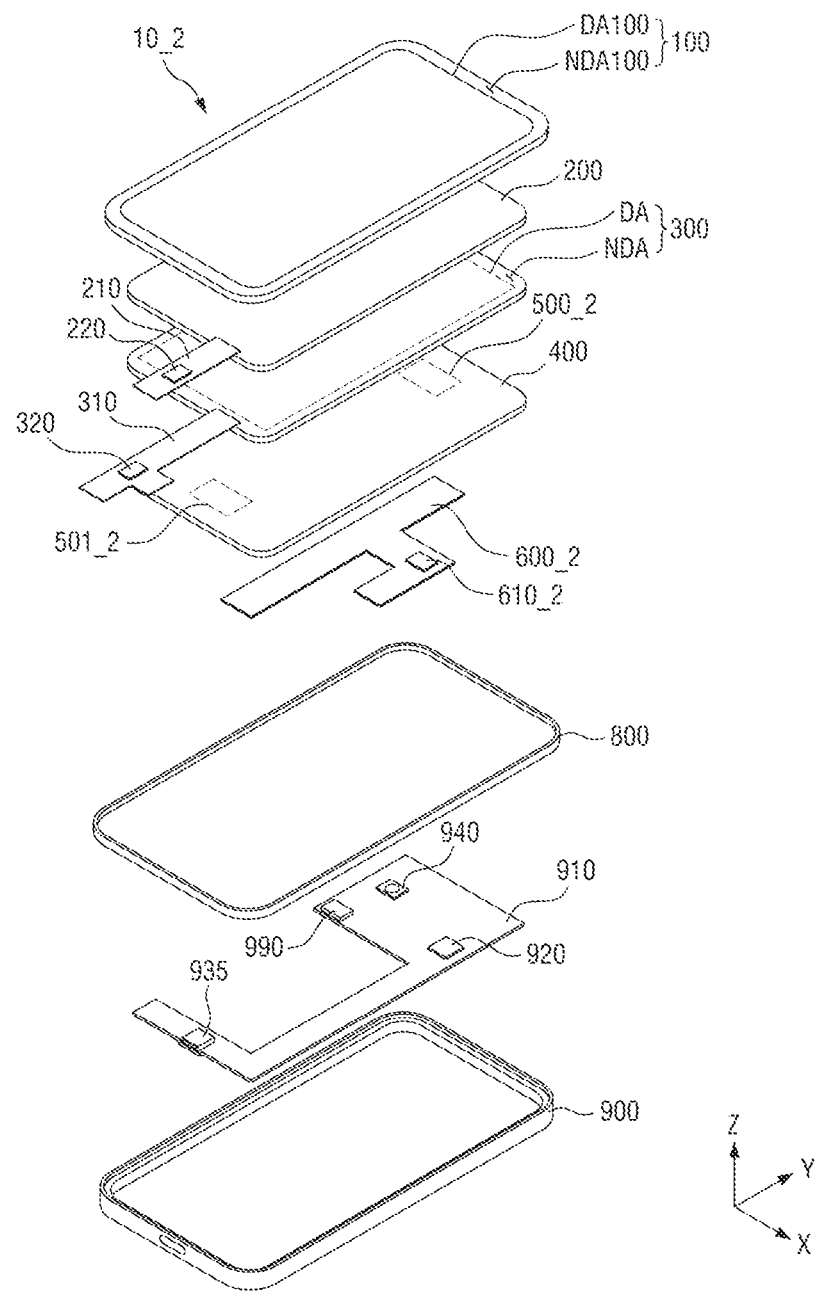
Figure 16:
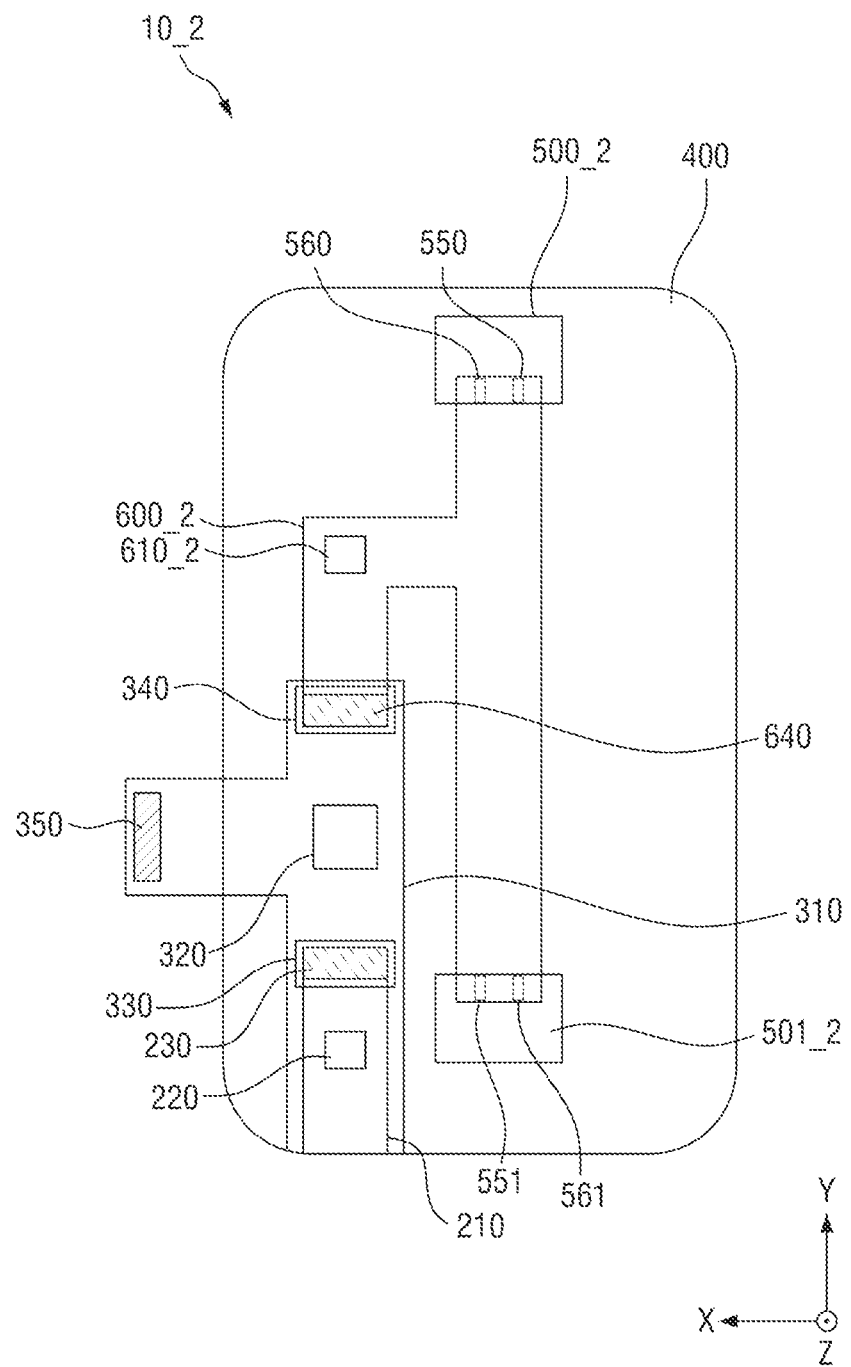
FIG. 16 is a rear view illustrating a panel lower member, a first vibration element, a vibration circuit board, a panel circuit board, and a touch circuit board in the display device of FIG. 15B.

FIGS. 15A and 15B are perspective and exploded perspective views of a display device according to another alternative embodiment. FIG. 16 is a rear view illustrating a panel lower member, a first vibration element, a vibration circuit board, a panel circuit board, and a touch circuit board in the display device of FIG. 15B.

An embodiment shown in FIGS. 15A and 15B is different from the embodiment of FIGS. 1A and 1B in that a second vibration element 501_2 is realized as a vibration generator attached to the lower surface of the display panel 300, and is mounted on a vibration circuit board 600_2 having an integrated vibration driver circuit 610 for transmitting vibration signals to a first vibration element 500_2 and the second vibration element 501_2. In FIGS. 15A and 15B, any repetitive detailed description of the same or like elements as those in the embodiment shown in FIGS. 1A and 1B will be simplified or omitted.

Referring to FIGS. 15A and 15B, the first vibration element 500_2 and the second vibration element 501_2 may be disposed on the lower surface of the panel lower member 400. The first vibration element 500_2 and the second vibration element 501_2 may be piezo actuators, and may include at least one of a PVDF film, a piezoelectric body of PZT, and an electroactive polymer film. The second vibration element 501_2 may be disposed symmetrically with the first vibration element 500_2 with respect to the center of the display panel 300. In one exemplary embodiment, for example, when the first vibration element 500_2 is disposed on the upper side of the display panel 300, the third vibration element 501_2 may be disposed on the lower side of the display panel 300. When the first vibration element 500_2 and the second vibration element 501_2 are arranged symmetrically, the vibration or sound generated from the first vibration element 500_2 and the second vibration element 501_2 may be more uniformly provided to the user.

The second vibration element 501_2 may be connected to the vibration circuit board 600_2. Specifically, as shown in FIGS. 15B and 16, the vibration circuit board 600_2 may be attached to the third pad 551 and fourth pad 561 of the second vibration element 501_2 using an anisotropic conductive film.

The integrated vibration driver circuit 610_2 may generate a fifth vibration signal and a sixth vibration signal in response to fifth vibration data and sixth vibration data provided from the main processor 920 of the main circuit board 910. In such an embodiment, the fifth vibration data and sixth vibration data of the main processor 920 may be provided to the integrated vibration driver circuit 610_2 through the main circuit board 910, the display circuit board 310 and the vibration circuit board 600_2. The fifth vibration signal of the integrated vibration driver circuit 610_2 may be transmitted to the first vibration element 500_2 through the vibration circuit board 600_2, and the sixth vibration signal of the integrated vibration driver circuit 610_2 may be transmitted to the second vibration element 501_2 through the vibration circuit board 600_2. The first vibration element 500_2 may generate fifth vibration in response to the fifth vibration signal. The display panel 300 may be vibrated by the fifth vibration of the first vibration element 500_2 to provide a fifth sound to the user. The second vibration element 501_2 may generate sixth vibration in response to the sixth vibration signal.

In addition, since the first vibration element 500_2 and the second vibration element 501_2 may be implemented substantially the same as the first vibration element 500 having been described with reference to FIGS. 1A and 1B, a detailed description thereof will be omitted.

According to the embodiment shown in FIGS. 15A, 15B, and 16, the first vibration element 500_2 and the second vibration element 501_2 are attached to the panel lower member 400 disposed under the display panel 300 and connected to the vibration circuit board 600_2 provided with the integrated vibration driver circuit 610_2, and the integrated vibration driver circuit 610_2 is connected to the display circuit board 310, thereby modulating the first vibration element 500_2, the second vibration element 501_2 and the vibration circuit board 600_2 with the display panel 300 into one module.

Figure 17:
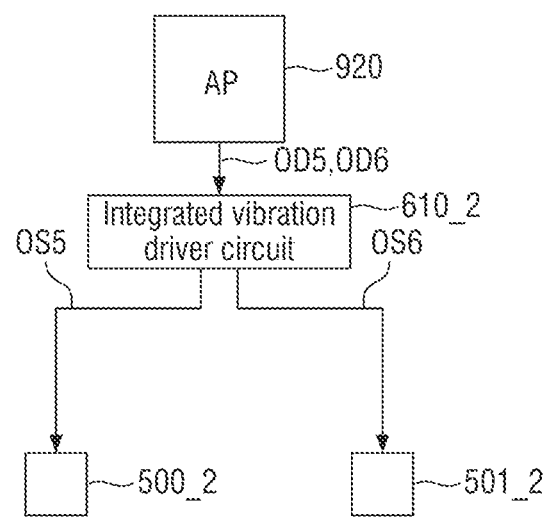
FIG. 17 is a block diagram illustrating a method of driving a first vibration element and a second vibration element according to another alternative embodiment.

FIG. 17 is a block diagram illustrating a method of driving a first vibration element and a second vibration element according to another alternative embodiment.

Referring to FIG. 17, the main processor 920 may provide fifth vibration data OD5 and sixth vibration data OD6 to the integrated vibration driver circuit 610_2. The fifth vibration data OD5 and the sixth vibration data OD6 may be digital data including information on the amplitude and frequency of a voltage for driving the first vibration element 500_2 and the second vibration element 501_2. However, the invention is not limited thereto. In another alternative embodiment, the fifth vibration data OD5 and/or the sixth vibration data OD6 may be an analog signal, not a digital signal.

The integrated vibration driver circuit 610_2 may receive the fifth vibration data OD5 and the sixth vibration data OD6 to generate a fifth vibration signal OS5 and a sixth vibration signal OS6. The fifth vibration signal OS5 and the sixth vibration signal OS6 may be analog signals. That is, the fifth vibration signal OS5 and the sixth vibration signal OS6 may be voltage signals for driving the first vibration element 500_2 and the second vibration element 501_2.

The first vibration element 500_2 and the third vibration element 501_2 may control vibrations according to the amplitude and frequency of the fifth vibration signal OS5 and the sixth vibration signal OS6, respectively, and may output vibrations of various patterns. The first vibration element 500_2 may output a fifth vibration, and the second vibration element 501_2 may output a sixth vibration.

The fifth vibration signal OS5 may be different from the sixth vibration signal OS6, and thus the fifth vibration of the first vibration element 500_2 may be different from the sixth vibration of the second vibration element 501_2. In an embodiment, the sixth vibration signal OS6 transmitted to the second vibration element 501_2 may be a reverse-phase signal inverted from the fifth vibration signal OS5. In such an embodiment, where the sixth vibration signal OS6 is a reverse phase signal of the fifth vibration signal OS5, the phases of the fifth and sixth vibrations may be opposite to each other.

Accordingly, the vibration or sound generated from the lower surface of the display device ("10_2" in FIG. 15A) may be offset and thus the magnitude thereof may be reduced.

As described above, according to embodiments of the display device, a set vibration generated at the time of outputting a sound using a vibration element may be reduced.

In such embodiments, a sound pressure level of a medium/low frequency sound may be improved.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:
1. A display device comprising:
    a display panel which displays an image;
    a lower frame disposed under the display panel;
    a first vibration element attached to a lower surface of the display panel, wherein the first vibration element generates a first vibration based on a first vibration signal;
    a second vibration element disposed under the lower frame, wherein the second vibration element generates a second vibration based on a second vibration signal;
    a first vibration driver circuit which provides the first vibration signal to the first vibration element;

a main circuit board disposed under the lower frame; and a vibration circuit board disposed between the display panel and the lower frame and electrically connected to the main circuit board and the first vibration element, wherein the first vibration driver circuit is disposed on the vibration circuit board, and, wherein a phase of the second vibration signal is opposite to a phase of the first vibration signal.

2. The display device of claim 1, wherein a period of the second vibration is the same as a period of the first vibration.

3. The display device of claim 2, wherein the first vibration element includes a vibration material layer, the vibration material layer includes at least one of a piezoelectric body, a piezoelectric film and an electro-active polymer film, and the second vibration element includes a linear resonance actuator.

4. The display device of claim 1, further comprising:

a main processor disposed on the main circuit board, wherein the main processor generates first vibration data and provides the first vibration data to the first vibration driver circuit, and the first vibration driver circuit generates the first vibration signal based on the first vibration data.

5. The display device of claim 4, further comprising:

a second vibration driver circuit disposed on the main circuit board to be adjacent to the second vibration element, wherein the second vibration driver circuit provides the second vibration signal to the second vibration element.

6. The display device of claim 5, wherein a magnitude of vibration at a position above the display panel is greater than a magnitude of vibration at a lower position of the display panel.

7. The display device of claim 4, wherein the main processor provides the second vibration signal to the second vibration element, and the second vibration signal is an analog signal.

8. The display device of claim 1, wherein the first vibration element generates a first sound corresponding to the first vibration, and the second vibration element generates a second sound corresponding to the second vibration.

9. The display device of claim 8, wherein a sound pressure level of the first sound at an upper position of the display panel is higher than a sound pressure level of the first sound at a lower position and a side position of the display panel.

* * * * *